(12) United States Patent
Pachamuthu et al.

(10) Patent No.: US 11,101,284 B2
(45) Date of Patent: Aug. 24, 2021

(54) THREE-DIMENSIONAL MEMORY DEVICE CONTAINING ETCH STOP STRUCTURES AND METHODS OF MAKING THE SAME

(71) Applicant: SANDISK TECHNOLOGIES LLC, Addison, TX (US)

(72) Inventors: Jayavel Pachamuthu, San Jose, CA (US); Hiroyuki Kinoshita, San Jose, CA (US); Masaaki Higashitani, Cupertino, CA (US); Makoto Dei, Yokkaichi (JP); Junji Oh, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 113 days.

(21) Appl. No.: 16/224,367

(22) Filed: Dec. 18, 2018

(65) Prior Publication Data

US 2020/0194450 A1 Jun. 18, 2020

(51) Int. Cl.
*H01L 27/11548* (2017.01)
*H01L 27/11575* (2017.01)
(Continued)

(52) U.S. Cl.
CPC .. *H01L 27/11582* (2013.01); *H01L 21/02532* (2013.01); *H01L 21/266* (2013.01);
(Continued)

(58) Field of Classification Search
CPC ......... H01L 27/11553; H01L 27/11556; H01L 27/1158; H01L 27/11582; H01L 27/11548; H01L 27/11575; H01L 21/26506; H01L 21/26513; H01L 21/26533; H01L 21/266; H01L 21/308; H01L 21/3081; H01L 27/11551–11556; H01L 27/11578–11582; H01L 27/11519; H01L 27/11565; H01L 27/11526; H01L 27/11573; H01L 21/02532;
(Continued)

(56) References Cited

U.S. PATENT DOCUMENTS 5,915,167 A 6/1999 Leedy
8,614,126 B1 12/2013 Lee et al.
(Continued)

OTHER PUBLICATIONS

U.S. Appl. No. 15/715,629, filed Sep. 26, 2017, Sandisk Technologies LLC.
(Continued)

*Primary Examiner* — Yu Chen
(74) *Attorney, Agent, or Firm* — The Marbury Law Group PLLC

(57) ABSTRACT

A method of forming a semiconductor structure includes providing a dopant species selected from carbon, boron, nitrogen or oxygen into an upper portion of a semiconductor region to form a doped etch stop semiconductor material portion over a remaining semiconductor material portion, forming an overlying material portion over the etch stop semiconductor material portion, etching through the overlying material portion by an etch process that removes the overlying material portion selective to a material of the etch stop semiconductor material portion, and depositing at least one fill material over the etch stop semiconductor material portion.

20 Claims, 35 Drawing Sheets

(51) Int. Cl.
    *H01L 27/11556*    (2017.01)
    *H01L 27/11582*    (2017.01)
    *H01L 23/522*      (2006.01)
    *H01L 29/10*       (2006.01)
    *H01L 29/08*       (2006.01)
    *H01L 21/311*      (2006.01)
    *H01L 21/02*       (2006.01)
    *H01L 21/265*      (2006.01)
    *H01L 21/266*      (2006.01)
    *H01L 29/49*       (2006.01)
    *H01L 21/768*      (2006.01)
    *H01L 27/11519*    (2017.01)
    *H01L 27/11565*    (2017.01)
    *H01L 27/11526*    (2017.01)
    *H01L 27/11573*    (2017.01)
    *H01L 21/822*      (2006.01)

(52) U.S. Cl.
    CPC .. *H01L 21/26506* (2013.01); *H01L 21/26513* (2013.01); *H01L 21/26533* (2013.01); *H01L 21/31111* (2013.01); *H01L 21/76802* (2013.01); *H01L 21/76877* (2013.01); *H01L 21/8221* (2013.01); *H01L 23/5226* (2013.01); *H01L 27/11519* (2013.01); *H01L 27/11526* (2013.01); *H01L 27/11548* (2013.01); *H01L 27/11556* (2013.01); *H01L 27/11565* (2013.01); *H01L 27/11573* (2013.01); *H01L 27/11575* (2013.01); *H01L 29/0847* (2013.01); *H01L 29/1037* (2013.01); *H01L 29/4916* (2013.01)

(58) Field of Classification Search
    CPC ......... H01L 21/31111; H01L 21/32134; H01L 21/76802; H01L 21/76877; H01L 23/5226
    See application file for complete search history.

(56) References Cited

U.S. PATENT DOCUMENTS

| | | |
|---|---|---|
| 8,828,884 B2 | 9/2014 | Lee et al. |
| 9,023,719 B2 | 5/2015 | Pachamuthu et al. |
| 9,230,979 B1 | 1/2016 | Pachamuthu et al. |
| 9,437,606 B2 | 9/2016 | Makala et al. |
| 9,460,931 B2 | 10/2016 | Pachamuthu et al. |
| 9,524,976 B2 | 12/2016 | Pachamuthu et al. |
| 9,530,788 B2 | 12/2016 | Oginoe et al. |
| 9,548,313 B2 | 1/2017 | Yada et al. |
| 9,576,967 B1 | 2/2017 | Kimura et al. |
| 9,659,956 B1 | 5/2017 | Pachamuthu et al. |
| 9,728,547 B1 | 8/2017 | Ohsaki et al. |
| 9,754,820 B2 | 9/2017 | Tsutsumi et al. |
| 9,754,956 B2 | 9/2017 | Tsutsumi et al. |
| 9,754,958 B2 | 9/2017 | Pachamuthu et al. |
| 9,842,851 B2 | 12/2017 | Pachamuthu et al. |
| 10,014,316 B2 | 7/2018 | Yu et al. |
| 10,074,666 B2 | 9/2018 | Ge et al. |
| 10,115,730 B1 | 10/2018 | Baraskar et al. |
| 2015/0079757 A1* | 3/2015 | Jeon ................... H01L 21/0332 438/396 |
| 2017/0287926 A1* | 10/2017 | Ariyoshi ........... H01L 27/11575 |
| 2018/0130812 A1* | 5/2018 | Hosoda ............. H01L 27/11517 |

OTHER PUBLICATIONS

U.S. Appl. No. 15/840,090, filed Dec. 13, 2017, Sandisk Technologies LLC.
U.S. Appl. No. 15/943,859, filed Apr. 3, 2018, Sandisk Technologies LLC.

* cited by examiner

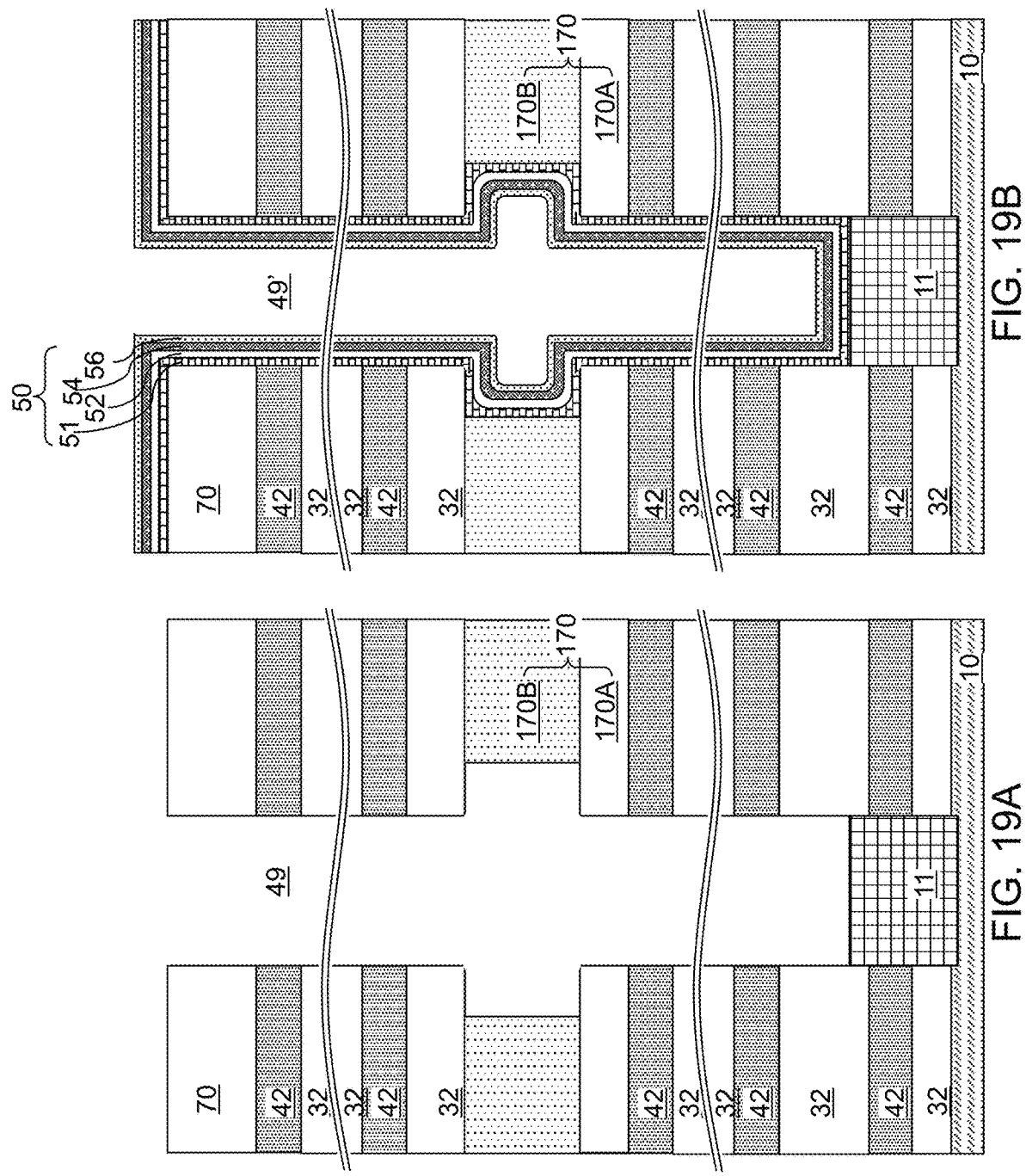

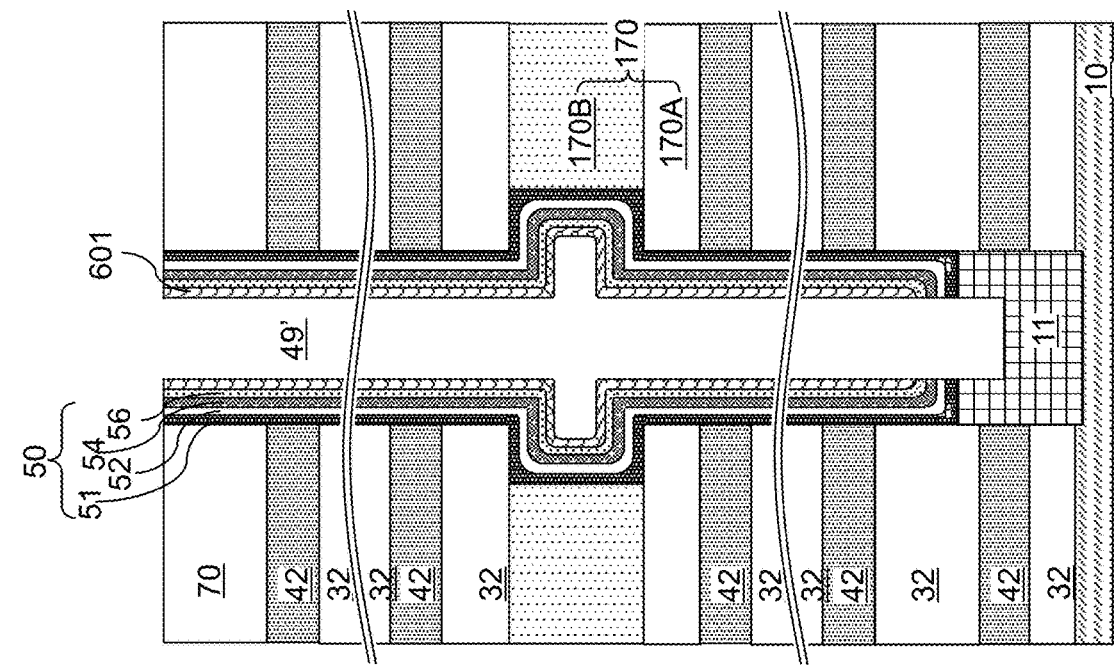
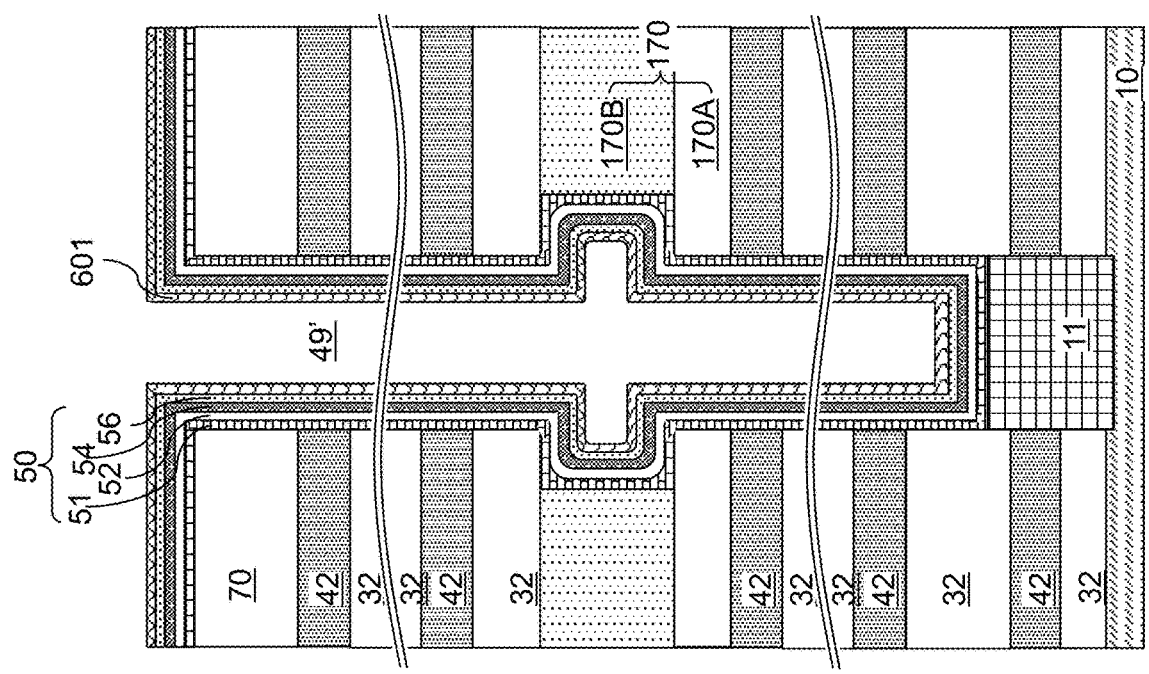

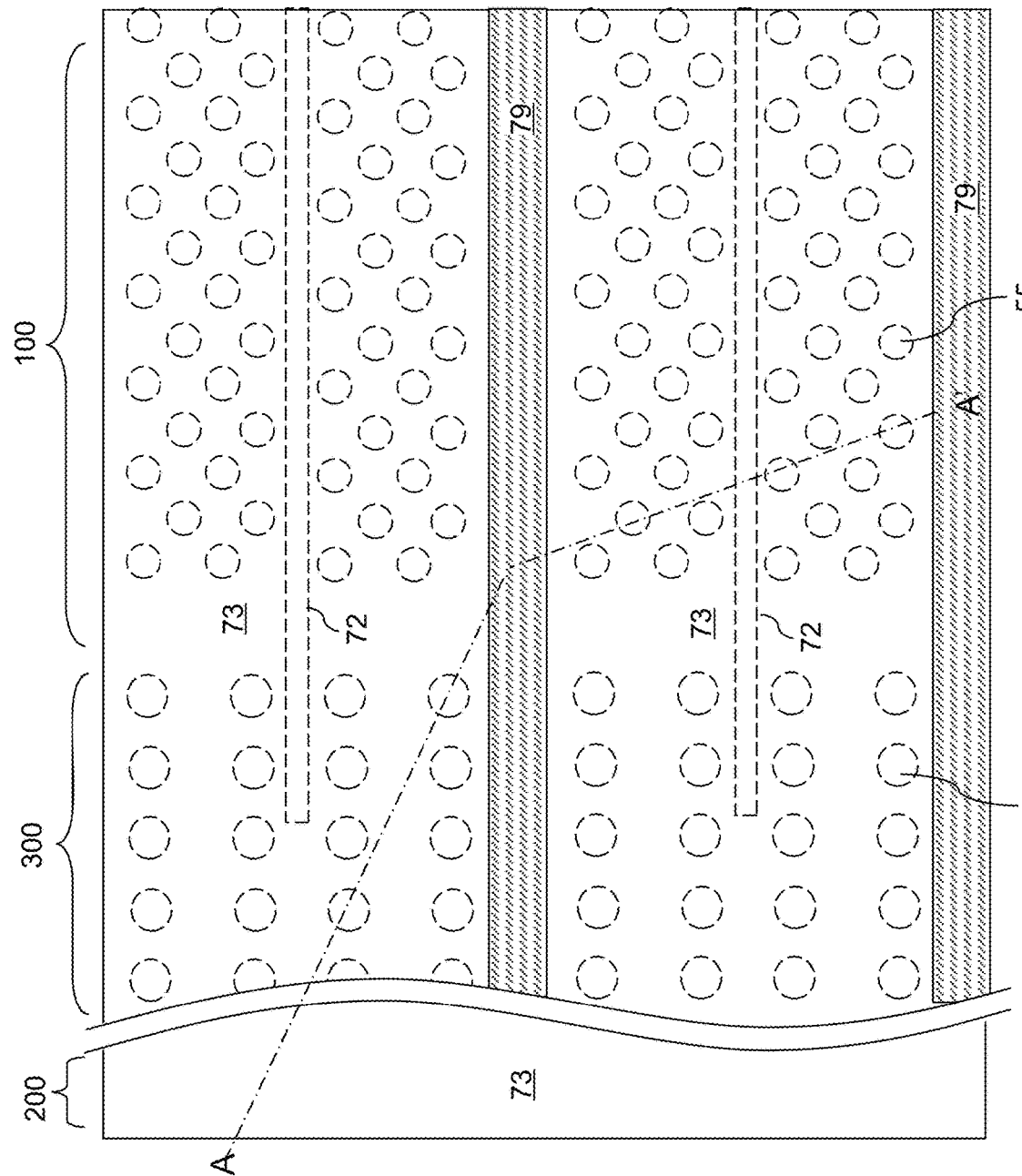

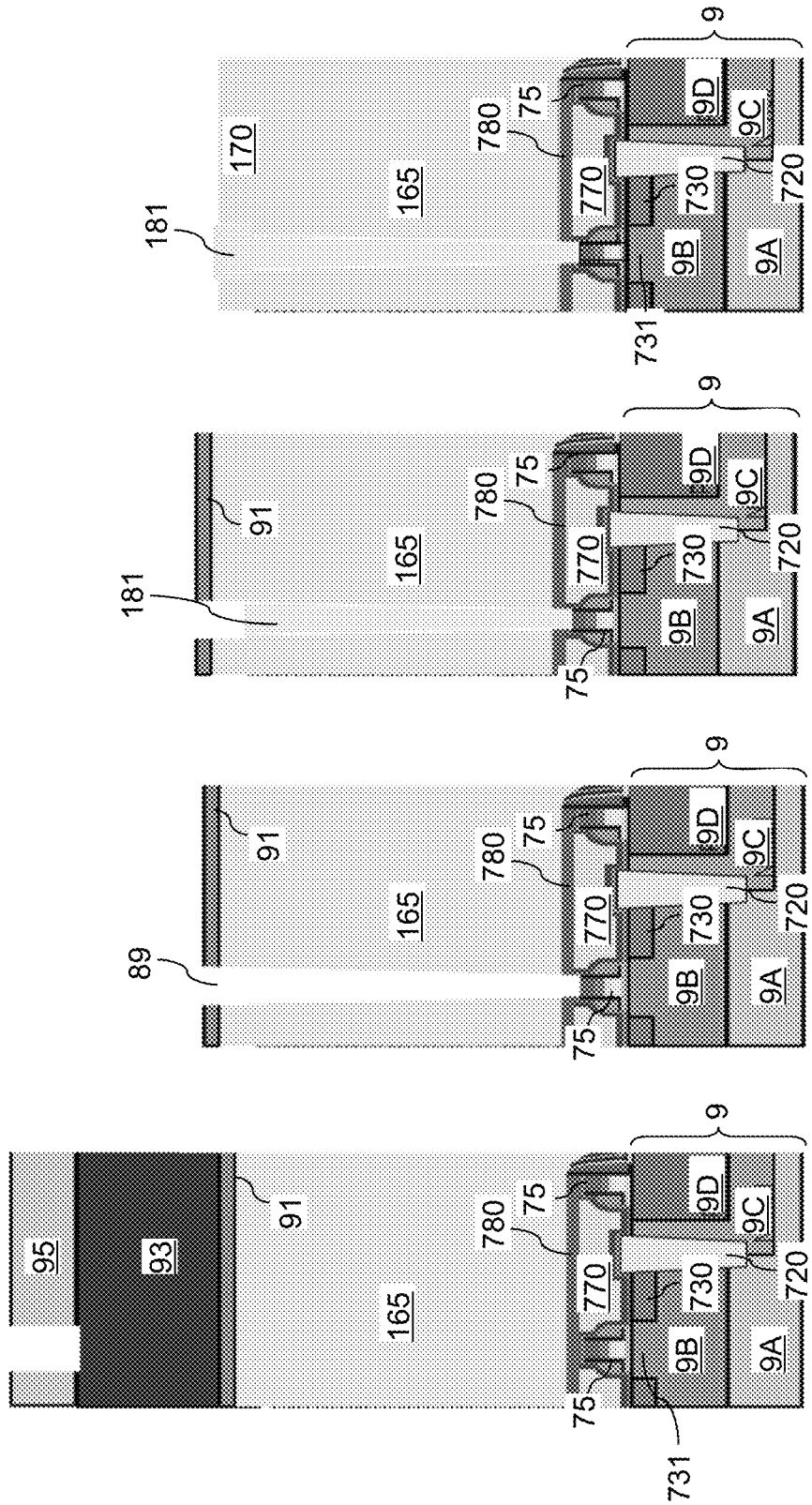

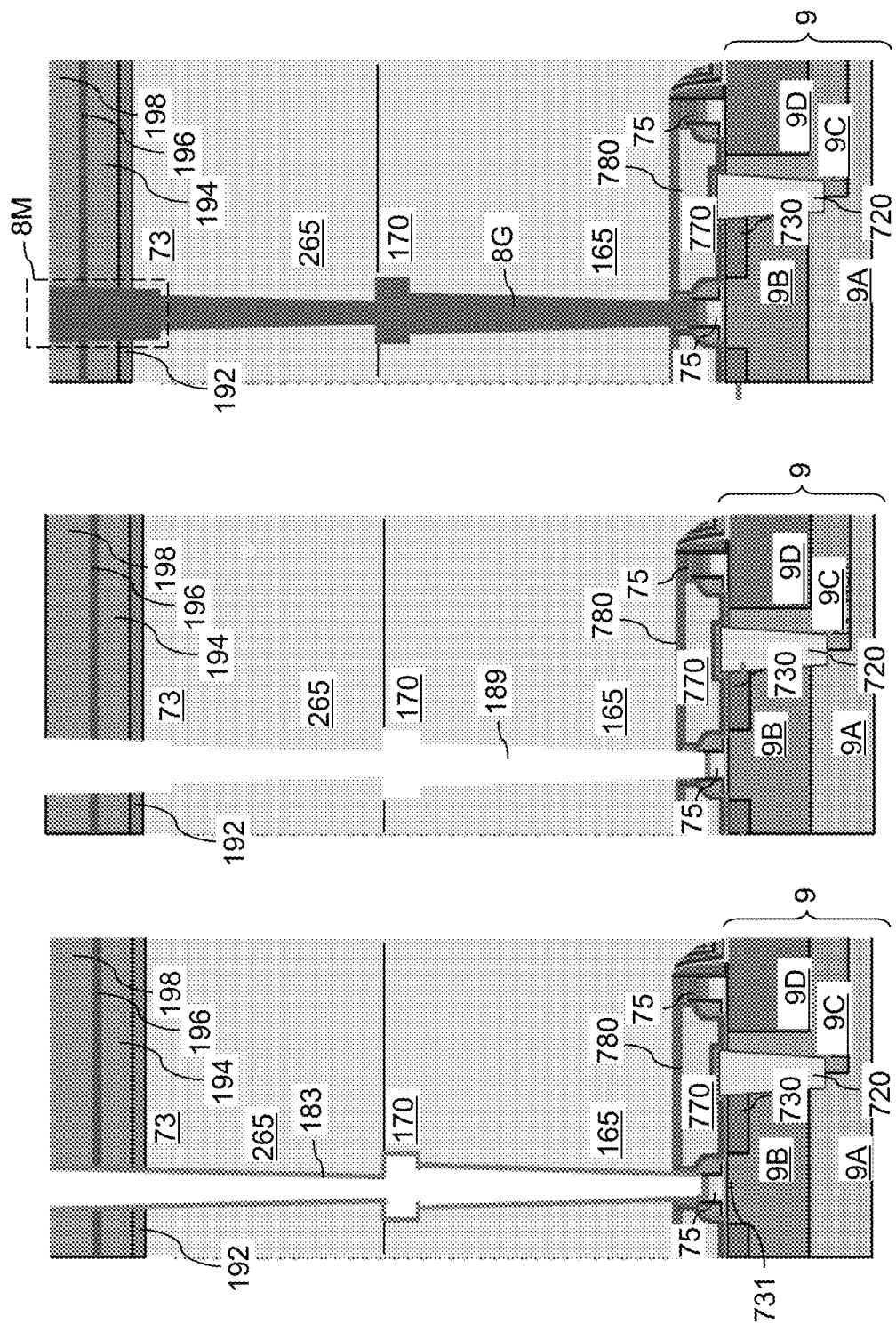

THREE-DIMENSIONAL MEMORY DEVICE CONTAINING ETCH STOP STRUCTURES AND METHODS OF MAKING THE SAME

FIELD

The present disclosure relates generally to the field of semiconductor devices and specifically to a three-dimensional memory device including etch stop structures and methods of making the same.

BACKGROUND

Recently, ultra-high-density storage devices employing three-dimensional (3D) memory stack structures have been proposed. For example, a three-dimensional NAND memory device can employ an array of an alternating stack of insulating materials and spacer material layers that is formed over a substrate containing peripheral devices (e.g., driver/logic circuits). The spacer material layers can be formed as electrically conductive layers, or can be formed as sacrificial material layers that are subsequently replaced with electrically conductive layers. Memory openings and support openings are formed through the alternating stack, and filled with respective memory stack structures or support pillar structures.

SUMMARY

According to an aspect of the present disclosure, a three-dimensional memory device comprises an alternating stack of insulating layers and electrically conductive layers located over a substrate; a memory opening fill structure extending through the alternating stack and comprising a first pedestal channel portion, a first memory film and a first vertical semiconductor channel, a staircase region including stepped surfaces of the alternating stack, and a support pillar structure extending through a portion of the alternating stack in the staircase region and comprising a second semiconductor pedestal channel portion, a second memory film, and a second vertical semiconductor channel. The second semiconductor pedestal channel portion comprises a semiconductor etch stop pedestal segment containing a dopant species overlying a semiconductor remaining pedestal segment, and the etch stop pedestal segment has an etch rate than is at least 5 times less in trimethyl-2 hydroxyethyl ammonium hydroxide (TMY) than the remaining pedestal segment.

According to another aspect of the present disclosure, a semiconductor structure comprises a field effect transistor comprising a gate structure overlying channel and active regions, wherein the gate structure comprises a vertical stack including a gate dielectric and an etch stop gate semiconductor material portion overlying a remaining semiconductor material portion, wherein the etch stop gate semiconductor material portion contains a dopant species and has an etch rate than is at least 5 times less in trimethyl-2 hydroxyethyl ammonium hydroxide (TMY) than the remaining semiconductor material portion, at least one dielectric material portion overlying the gate structure, and a gate contact via structure extending through the at least one dielectric material portion and contacting the etch stop gate semiconductor material portion.

According to yet another aspect of the present disclosure, a method of forming a semiconductor structure comprises providing a dopant species selected from carbon, boron, nitrogen or oxygen into an upper portion of a semiconductor region to form a doped etch stop semiconductor material portion over a remaining semiconductor material portion, forming an overlying material portion over the etch stop semiconductor material portion, etching through the overlying material portion by an etch process that removes the overlying material portion selective to a material of the etch stop semiconductor material portion employing an etch chemistry that provides a higher selectivity with an increasing concentration of the dopant species within the etch stop semiconductor material portion, and depositing at least one fill material over the etch stop semiconductor material portion.

BRIEF DESCRIPTION OF THE DRAWINGS

FIGS. 19A-19F illustrate sequential vertical cross-sectional views of a memory openings during formation of a memory opening fill structure according to an embodiment of the present disclosure.

FIG. 21B is a horizontal cross-sectional of the exemplary structure along the horizontal plane B-B' of FIG. 21A. The hinged vertical plane A-A' corresponds to the plane of the vertical cross-sectional view of FIG. 21A.

FIG. 25 is a vertical cross-sectional view of a first configuration of the exemplary structure after application and patterning of a photoresist layer over the contact level dielectric layer at an initial step for formation of a gate contact via structure according to an embodiment of the present disclosure.

FIG. 26 is a vertical cross-sectional view of the exemplary structure after formation a gate contact via cavity according to an embodiment of the present disclosure.

FIG. 27 is a vertical cross-sectional view of the exemplary structure after formation a lower portion of a gate contact via structure according to an embodiment of the present disclosure.

FIG. 28 is a vertical cross-sectional view of the exemplary structure after formation an upper portion of the gate contact via structure according to an embodiment of the present disclosure.

FIG. 29 is a vertical cross-sectional view of a second configuration of the exemplary structure after application of a photoresist layer over the contact level dielectric layer at an initial step for formation of a gate contact via structure according to an embodiment of the present disclosure.

FIG. 30 is a vertical cross-sectional view of a second configuration of the exemplary structure after formation of an upper gate via cavity according to an embodiment of the present disclosure.

FIG. 31 is a vertical cross-sectional view of a second configuration of the exemplary structure after formation of a gate via cavity by removal of a sacrificial gate contact structure according to an embodiment of the present disclosure.

FIG. 32 is a vertical cross-sectional view of a second configuration of the exemplary structure after formation of an optional sacrificial liner according to an embodiment of the present disclosure.

FIG. 33 is a vertical cross-sectional view of a second configuration of the exemplary structure after removal of the optional sacrificial liner according to an embodiment of the present disclosure.

FIG. 34 is a vertical cross-sectional view of a second configuration of the exemplary structure after formation of a gate contact via structure according to an embodiment of the present disclosure.

DETAILED DESCRIPTION

Figure 1:
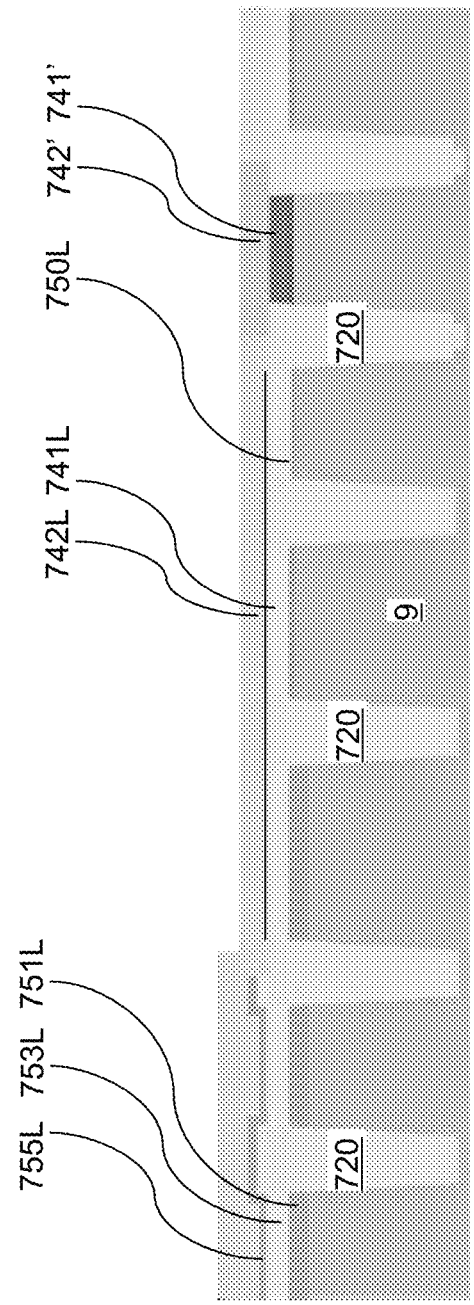
FIG. 1 is a vertical cross-sectional view of an exemplary structure after formation of gate dielectric layers and gate semiconductor material layers according to an embodiment of the present disclosure.

In one embodiment, sacrificial opening fill material portions can be formed in the memory openings and/or the support openings during initial processing of the device followed by replacing the sacrificial opening fill material portions and the memory stack structures and support pillar structures. Alternatively or in addition, sacrificial via fill structures can be formed on peripheral devices on a substrate prior to replacement with metallic via structures. Polysilicon or amorphous silicon can be used as the sacrificial material for forming the sacrificial opening fill material portions and the sacrificial via fill structures. Overetch of an underlying material during removal of the sacrificial material can deteriorate electrical isolation for the structures that replace the sacrificial material. For example, overetch into pedestal channel portion within support openings can cause voids that are subsequently filled with undesirable materials that cause leakage current paths in support pillar structures. Further, overetch into gate structures of peripheral field effect transistors after formation of a three-dimensional memory array can cause damage to gate dielectrics. Embodiments of the present disclosure provide a three-dimensional memory device including etch stop structures and methods of making the same, the various aspects of which are described herein in detail. The etch stop structures avoid or minimize structural collateral damage and deterioration of electrical isolation that can occur during removal of the sacrificial material. The embodiments of the present disclosure can be employed to form various semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1\times10^{-5}$ S/m to $1\times10^{5}$ S/m. As used herein, a "semiconductor material" refers to a material having electrical conductivity in the range from $1\times10^{-5}$ S/m to 1.0 S/m in the absence of electrical dopants therein, and is capable of producing a doped material having electrical conductivity in a range from 1 S/m to $1\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1\times10^{5}$ S/m. As used herein, an "insulator material" or a "dielectric material" refers to a material having electrical conductivity less than $1\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1\times10^{-5}$ S/m to $1\times10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device.

Referring to FIG. 1, an exemplary structure according to an embodiment of the present disclosure is illustrated, which comprises a substrate semiconductor layer 9. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate semiconductor layer 9 can include various doped wells (9A, 9B, 9C, 9D shown in FIG. 25) having a respective doping of electrical dopants. For example, p-type wells and n-type wells can be provided within the substrate semiconductor layer 9. At least one semiconductor device can be formed on a portion of the substrate semiconductor layer 9. The at least one semiconductor device can include, for example, field effect transistors and flash memory devices. The at least one semiconductor device can include components for a peripheral circuitry that support operation of a three-dimensional memory device to be subsequently formed.

Shallow trench isolation structures 720 can be formed by etching portions of the substrate semiconductor layer 9 and depositing a dielectric material therein. The shallow trench isolation structures 720 define various devices areas, and provide electrical isolation among neighboring semiconductor devices to be subsequently formed.

At least one gate dielectric layer (750L, 751L) can be formed on the top surface of the substrate semiconductor layer 9. The at least one gate dielectric layer (750L, 751L) can be included in subsequently formed peripheral devices (e.g., driver circuit devices, such as field effect transistors in CMOS or non-CMOS configurations). A first gate dielectric layer 750L can be included in low voltage field effect transistors in CMOS or non-CMOS configurations and a second gate dielectric layer 751L can be included in high voltage field effect transistors, registers (which may include a flash memory device, such as a charge storage transistor) and/or capacitors. The second gate dielectric layer 751L can have a greater thickness than the first gate dielectric layer 750L. While the present disclosure is described employing two different gate dielectric layers (750L, 751L), multiple thicknesses can be employed for multiple gate dielectric layers that are employed to form different types of field effect transistors or flash memory devices.

A first gate semiconductor material can be deposited over the at least one gate dielectric layer (750L, 751L). Different portions of the first gate semiconductor material can be doped with dopants of different types and/or at different dopant concentrations to provide optimal gate doping for different types of semiconductor devices to be subsequently formed. The various portions of the first gate semiconductor material can include a first lower gate semiconductor layer 741L, a second lower gate semiconductor layer 741', and a floating gate material layer 753L. The second lower gate semiconductor layer 741' can have a doping of the opposite conductivity type than the first lower gate semiconductor layer 741L. For example, the first lower gate semiconductor layer 741L can be n-doped, the second lower gate semiconductor layer 741' can be p-doped, and the floating gate material layer 753L may be undoped.

A blocking dielectric layer 755L can be formed over the floating gate material layer 753L. The blocking dielectric layer 755L can include silicon oxide and/or aluminum oxide.

A second gate semiconductor material can be deposited over the first lower gate semiconductor layer 741L, the second lower gate semiconductor layer 741', and the blocking dielectric layer 755L. Different portions of the second gate semiconductor material can be doped with dopants of different types and/or at different dopant concentrations to provide optimal gate doping for different types of semiconductor devices to be subsequently formed. The various portions of the second gate semiconductor material can include a first upper gate semiconductor layer 742L and a second upper gate semiconductor layer 742'. The second upper gate semiconductor layer 742' can have a doping of the opposite conductivity type than the first upper gate semiconductor layer 742L. For example, the first upper gate semiconductor layer 742L can be n-doped, and the second upper gate semiconductor layer 742' can be p-doped. The first upper gate semiconductor layer 742L, the second upper gate semiconductor layer 742', the first lower gate semiconductor layer 741L, and the second lower gate semiconductor layer 741' collectively constitute in-process gate semiconductor portions, which are subsequently patterned to form gate semiconductor portions (i.e., portions of gate electrodes) in field effect transistors or control gate electrodes of charge storage transistors in registers.

Figure 2:
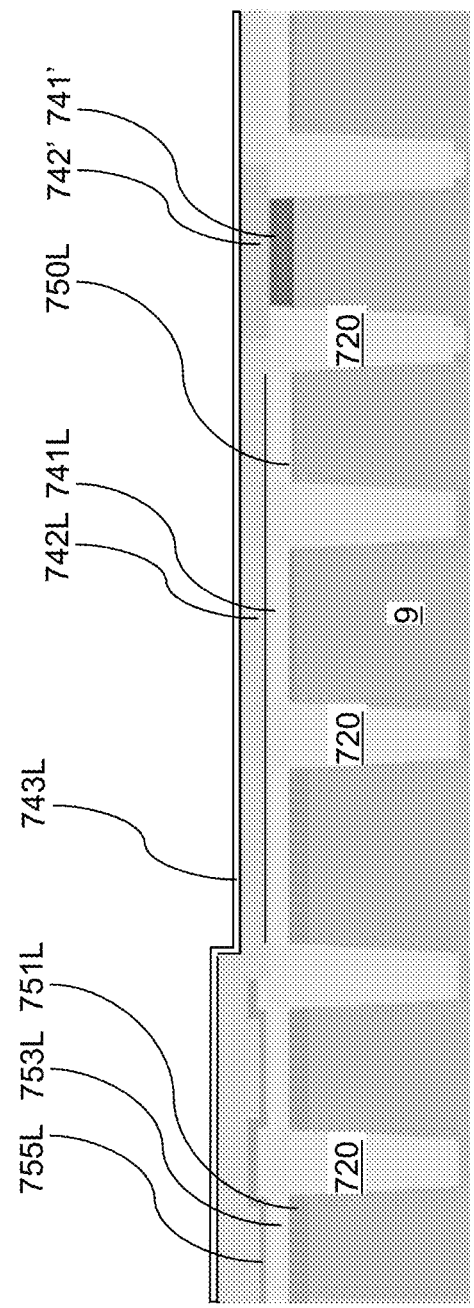
FIG. 2 is a vertical cross-sectional view of an exemplary structure after formation of a screen oxide layer according to an embodiment of the present disclosure.

Referring to FIG. 2, a screen oxide layer 743L can be optionally formed, for example, by thermal oxidation or plasma oxidation of a surface portion of the first upper gate semiconductor layer 742L and the second upper gate semiconductor layer 742'. The thickness of the screen oxide layer 743L can be in a range from 1 nm to 30 nm. The screen oxide layer 743L can reduce channeling of implanted ions during a subsequent ion implantation process.

Figure 3:
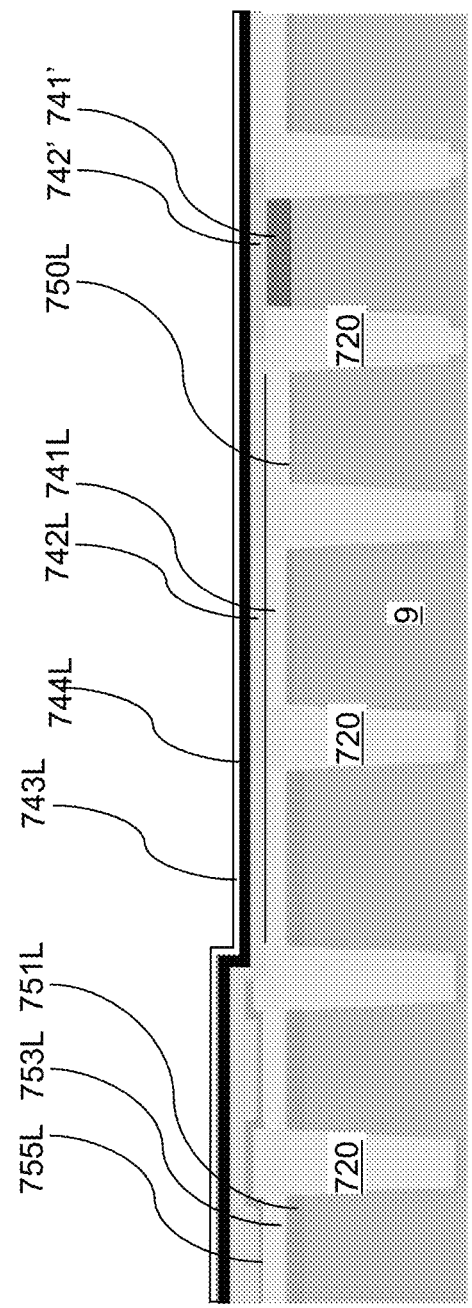
FIG. 3 is a vertical cross-sectional view of an exemplary structure after formation of an etch stop gate semiconductor material layer according to an embodiment of the present disclosure.

Referring to FIG. 3, a dopant species can be implanted into upper portions of the first upper gate semiconductor layer 742L and the second upper gate semiconductor layer 742' underneath the screen oxide layer 743L. The implanted portions of the first upper gate semiconductor layer 742L and the second upper gate semiconductor layer 742' constitute an etch stop gate semiconductor material layer 744L. The ion implantation energy can be 5 to 15 keV, such as 5 to 10 keV, and the implant does can be $1 \times 10^{15}$ cm$^{-2}$ to $1 \times 10^{16}$ cm$^{-2}$, such as $1 \times 10^{15}$ cm$^{-2}$ to $5 \times 10^{15}$ cm$^{-2}$. The thickness of the etch stop gate semiconductor material layer 744L can be in a range from 2 nm to 20 nm, such as 5 nm to 10 nm, although lesser and greater thicknesses can also be employed. The dopant species can be an element that can impede etching of the semiconductor material the first upper gate semiconductor layer 742L and the second upper gate semiconductor layer 742' during a subsequent etch process. For example, the first upper gate semiconductor layer 742L and the second upper gate semiconductor layer 742' can include silicon, and the etch process can use hot trimethyl-2 hydroxyethyl ammonium hydroxide ("hot TMY"). In this case, the dopant species can include one or more of carbon, nitrogen, and oxygen.

In an alternative embodiment, rather than implanting the dopant species, the doped species can be incorporated into the upper portions of the first upper gate semiconductor layer 742L and the second upper gate semiconductor layer 742' in-situ during growth. In this alternative embodiment, the lower portions of the first upper gate semiconductor layer 742L and the second upper gate semiconductor layer 742' are grown by chemical vapor deposition without introducing the dopant species into the growth chamber. The dopant species are then added to the reactants (e.g., silane and phosphine) used to grow the upper portions of the first upper gate semiconductor layer 742L and the second upper gate semiconductor layer 742'. In this alternative embodiment, the screen oxide layer 743L is formed after in-situ doping the upper portions of the first upper gate semiconductor layer 742L and the second upper gate semiconductor layer 742'.

Lower portions of the first upper gate semiconductor layer 742L, lower portions of the second upper gate semiconductor layer 742', the first lower gate semiconductor layer 741L, the second lower gate semiconductor layer 741', and the floating gate material layer 753L are not doped with (e.g., not implanted with or not in-situ doped with) the dopant species during the ion implantation or the layer growth process, and are herein collectively referred to as the remaining semiconductor material portions (741L, 741', 753L, 742L, 742'). The doped upper portions of the first upper gate semiconductor layer 742L and the second upper gate semiconductor layer 742' containing the dopant species constitute the etch stop gate semiconductor material layer 744L.

The material composition of the etch stop gate semiconductor material layer 744L differs from the material composition of an immediately underlying remaining semiconductor material portions (which can be a remaining portion of the first upper gate semiconductor layer 742L and/or a remaining portion of the second upper gate semiconductor layer 742') by presence of the dopant species. In one embodiment, the etch stop gate semiconductor material layer 744L can include carbon, nitrogen, or oxygen, and the immediately underlying remaining semiconductor material portion may be free of carbon, nitrogen, and/or oxygen. In another embodiment, the etch stop gate semiconductor material layer 744L can have a higher concentration of carbon, nitrogen, and/or oxygen atoms than the immediately underlying remaining semiconductor material portion.

In one embodiment, the etch stop gate semiconductor material layer 744L can comprise the dopant species at an atomic concentration that is at least 20 times greater than an atomic concentration of the dopant species in the underlying remaining semiconductor material portions. In one embodiment, the dopant species can be selected from carbon, oxygen, and/or nitrogen, and the etch stop gate semiconductor material layer 744L contains the dopant species at a concentration in a range from $5 \times 10^{19}/cm^3$ to $5 \times 10^{21}/cm^3$. The etch stop gate semiconductor material layer 744L may also contain at least 95 atomic percent silicon and an electrical dopant selected from a p-type dopant (e.g., boron) and/or a n-type dopant (e.g., phosphorus or arsenic) at a concentration in a range from $5 \times 10^{19}/cm^3$ to $2 \times 10^{21}/cm^3$.

In one embodiment, the remaining semiconductor material portion(s) can comprise silicon at an atomic concentration greater than 95% and the electrical dopant (e.g., boron, phosphorus or arsenic) at a concentration in a range from $5 \times 10^{19}/cm^3$ to $2 \times 10^{21}/cm^3$. The remaining semiconductor material portion(s) contain no dopant species selected from C, O or N or at least 5 times less, such as at least 20 times less, of the dopant species selected from C, O or N than the etch stop gate semiconductor material layer 744L. For example, the remaining semiconductor material portion(s) contain dopant species selected from C, O or N at a concentration of less than $1 \times 10^{19}/cm^3$, including less than $1 \times 10^{18}/cm^3$, such as zero to $1 \times 10^{18}/cm^3$, for example $10^{12}/cm^3$ to $10^{15}/cm^3$.

In one embodiment, the remaining semiconductor material portion(s) (which may be a portion of the first upper gate semiconductor layer 742L and/or a portion of the second upper gate semiconductor layer 742') includes doped semiconductor material that free of the dopant species selected from C, N or O, or includes the dopant species selected from C, N or O at an atomic concentration that is less than 0.05 times an atomic concentration of the dopant species within the etch stop gate semiconductor material layer 744L. In one embodiment, the concentration of the dopant species in the etch stop gate semiconductor material layer 744L provides a significant increase in the etch resistance to the etch chemistry for etching silicon using TMY. For example, the etch stop gate semiconductor material layer 744L has an etch rate that is at least 5 times less, such as at least 20 times less, such as 20 to 100 times less, in TMY than the remaining semiconductor material portion(s).

Figure 4:
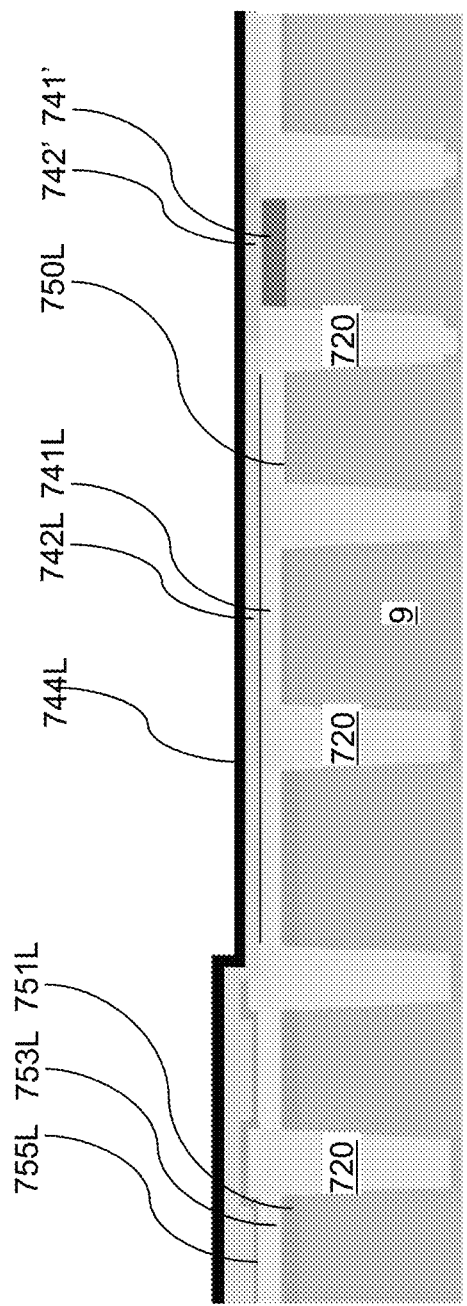
FIG. 4 is a vertical cross-sectional view of an exemplary structure after removal of the screen oxide layer according to an embodiment of the present disclosure.

Referring to FIG. 4, the screen oxide layer 743L can be removed selective to the etch stop gate semiconductor material layer 744L by an isotropic etch process. For example, a wet etch employing dilute hydrofluoric acid can be employed to etch the screen oxide layer 743L selective to the etch stop gate semiconductor material layer 744L.

Figure 5:
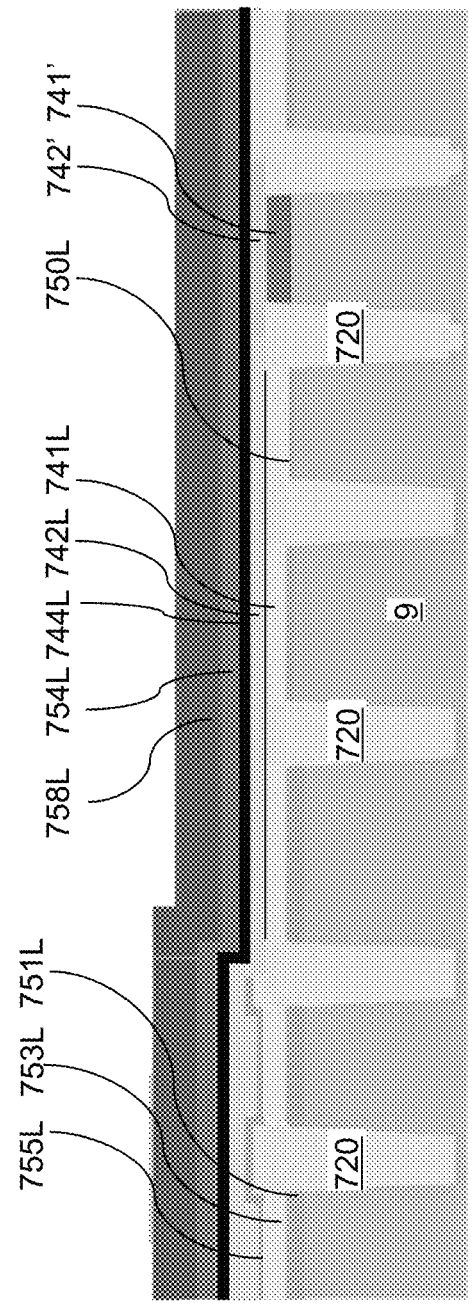
FIG. 5 is a vertical cross-sectional view of the exemplary structure after formation of a metallic silicide layer and a silicon nitride gate cap layer according to an embodiment of the present disclosure.

Referring to FIG. 5, a metallic silicide layer 754L and a silicon nitride gate cap layer 768L can be formed over the etch stop gate semiconductor material layer 744L. The metallic silicide layer 754L includes a metallic silicide material such as nickel silicide, titanium silicide, tungsten silicide, or other metal silicide. The thickness of the metallic silicide layer 754L can be in a range from 10 nm to 100 nm, although lesser and greater thicknesses can also be employed. The silicon nitride gate cap layer 768L includes silicon nitride, and may be formed by low pressure chemical vapor deposition or plasma enhanced chemical vapor deposition. The thickness of the silicon nitride gate cap layer 768L can be in a range from 20 nm to 200 nm, although lesser and greater thicknesses can also be employed. The metallic silicide layer 754L and the silicon nitride gate cap layer 758L overlie the etch stop gate semiconductor material layer 744L.

Figure 6:
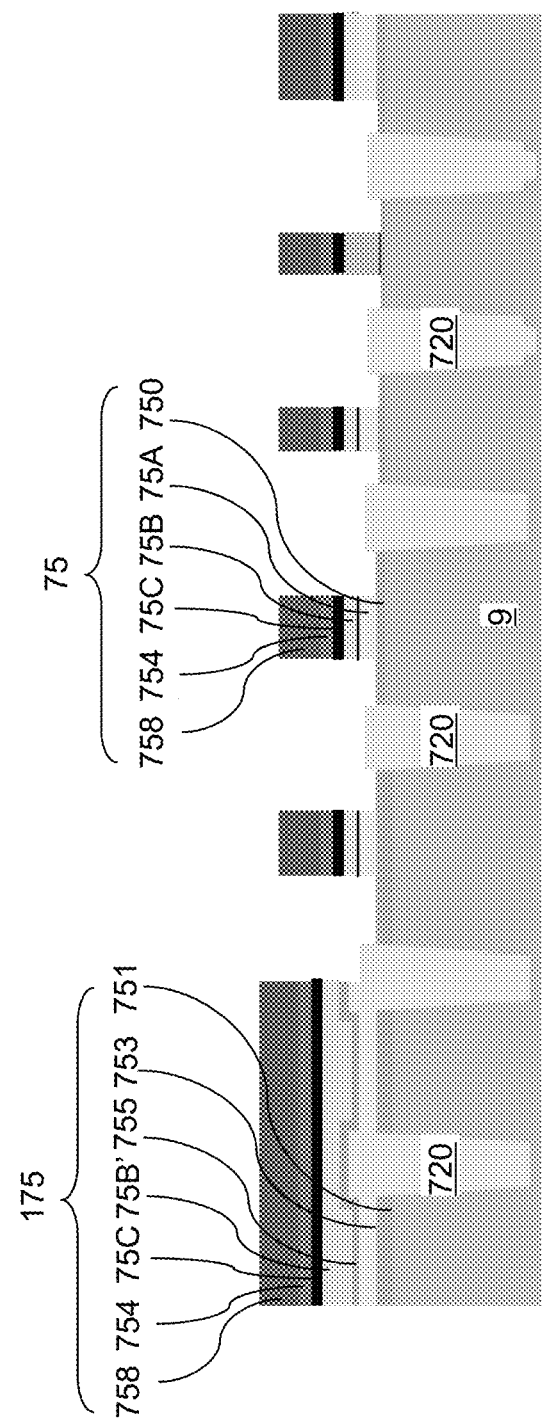
FIG. 6 is a vertical cross-sectional view of the exemplary structure after patterning gate structures according to an embodiment of the present disclosure.

Referring to FIG. 6, a photoresist layer (not shown) can be applied over the silicon nitride gate cap layer 768L, and can be lithographically patterned to cover regions in which gate structures are to be subsequently formed. An anisotropic etch process can be performed employing the patterned photoresist layer as an etch mask to etch unmasked portions of the gate-level material layers, which include the silicon nitride gate cap layer 768L, the metallic silicide layer 754L, the etch stop gate semiconductor material layer 744L, the first upper gate semiconductor layer 742L and the second upper gate semiconductor layer 742', the blocking dielectric layer 755L, the first lower gate semiconductor layer 741L, the second lower gate semiconductor layer 741', the floating gate material layer 753L, and the at least one gate dielectric layer (750L, 751L). The photoresist layer can be subsequently removed, for example, by ashing. Each remaining portion of the gate-level material layers constitute gate structures.

The gate structures can include a transistor gate structure 75 that contains a gate dielectric 750 that is a patterned portion of the first gate dielectric layer 750L, a first lower gate semiconductor portion 75A that is a patterned portion of the first lower gate semiconductor layer 741L, a first upper gate semiconductor portion 75B that is a patterned portion of the first upper gate semiconductor layer 742L, an etch stop gate semiconductor material portion 75C that is a patterned portion of the etch stop gate semiconductor material layer 744L, a metallic silicide portion 754 that is a patterned portion of the metallic silicide layer 754L, and a silicon nitride gate cap portion 758 that is a patterned portion of the silicon nitride gate cap layer 758L. The gate structures can also include a flash memory gate structure 175 of a charge storage transistor in a register region. The flash memory gate structure 175 contains a gate dielectric 751 that is a patterned portion of the second gate dielectric layer 751L, a floating gate electrode 753 that is a patterned portion of the floating gate material layer 753L, a blocking dielectric 755 that is a patterned portion of the blocking dielectric layer 755L, a control gate electrode 75B' that is a patterned portion of the first upper gate semiconductor layer 742L, an etch stop gate semiconductor material portion 75C that is a patterned portion of the etch stop gate semiconductor material layer 744L, a metallic silicide portion 754 that is a patterned portion of the metallic silicide layer 754L, and a silicon nitride gate cap portion 758 that is a patterned portion of the silicon nitride gate cap layer 758L.

Figure 7:
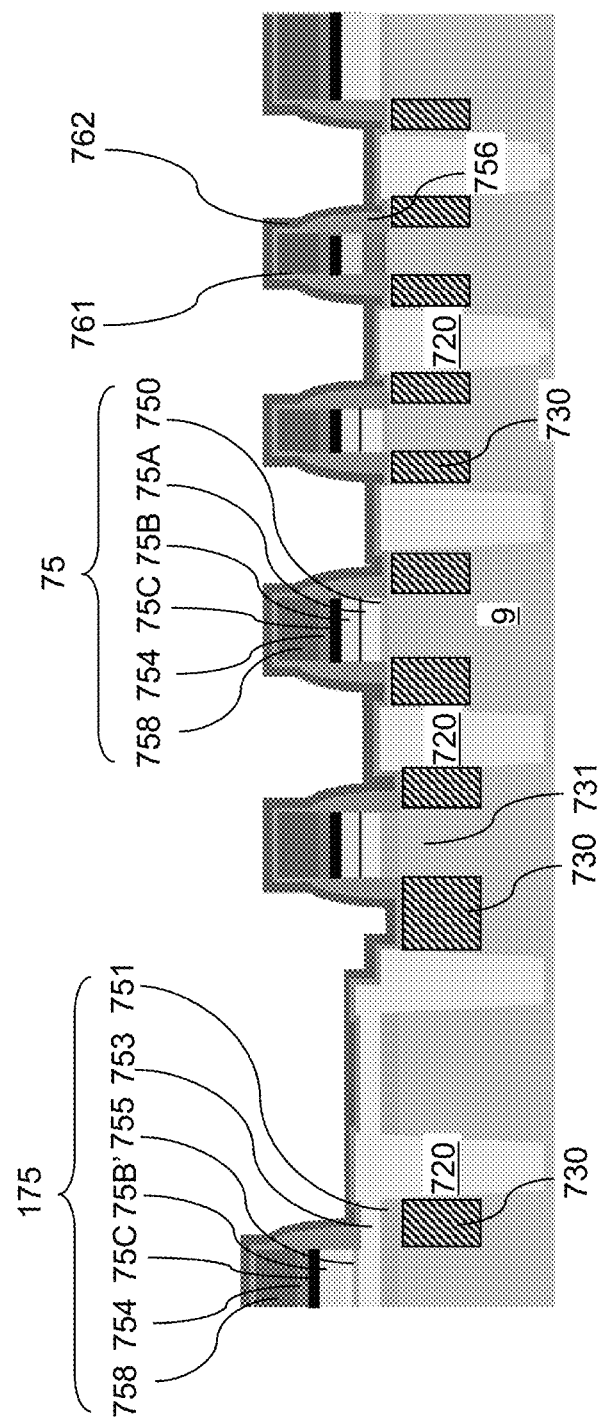
FIG. 7 is a vertical cross-sectional view of the exemplary structure after formation of gate spacers and dielectric liners according to an embodiment of the present disclosure.

Referring to FIG. 7, gate sidewall spacers 756 including a dielectric material can be formed by conformal deposition of a dielectric material layer and a subsequent anisotropic etch process that removes horizontal portions of the dielectric material layer. Each remaining tubular portion of the dielectric material layer constitutes a gate sidewall spacer 756 that surrounds a respective one of the gate structures (75, 175). Various active regions 730 such as source regions and drain regions can be formed in upper regions of the substrate semiconductor layer 9 by masked ion implantation processes that employ a combination of a respective patterned ion implantation mask layer (such as a photoresist layer) and/or the gate structures (75, 175) and/or the gate spacers 756 as an implantation mask structure. A semiconductor channel 731 is located between the respective source and drain regions 730.

A first dielectric liner 761 and a second dielectric liner 762 can be optionally formed. The first dielectric liner 761 can include a dielectric material such as silicon oxide, and can be conformally formed over the active regions 730 and the gate structures (75, 175). The first dielectric liner 761 can have a thickness in a range from 2 nm to 20 nm, although lesser and greater thicknesses can also be employed. The second dielectric liner 762 can include a dielectric material such as silicon nitride, and can be conformally formed over the first dielectric liner 761. The second dielectric liner 762 can have a thickness in a range from 4 nm to 40 nm, although lesser and greater thicknesses can also be employed.

Figure 8:
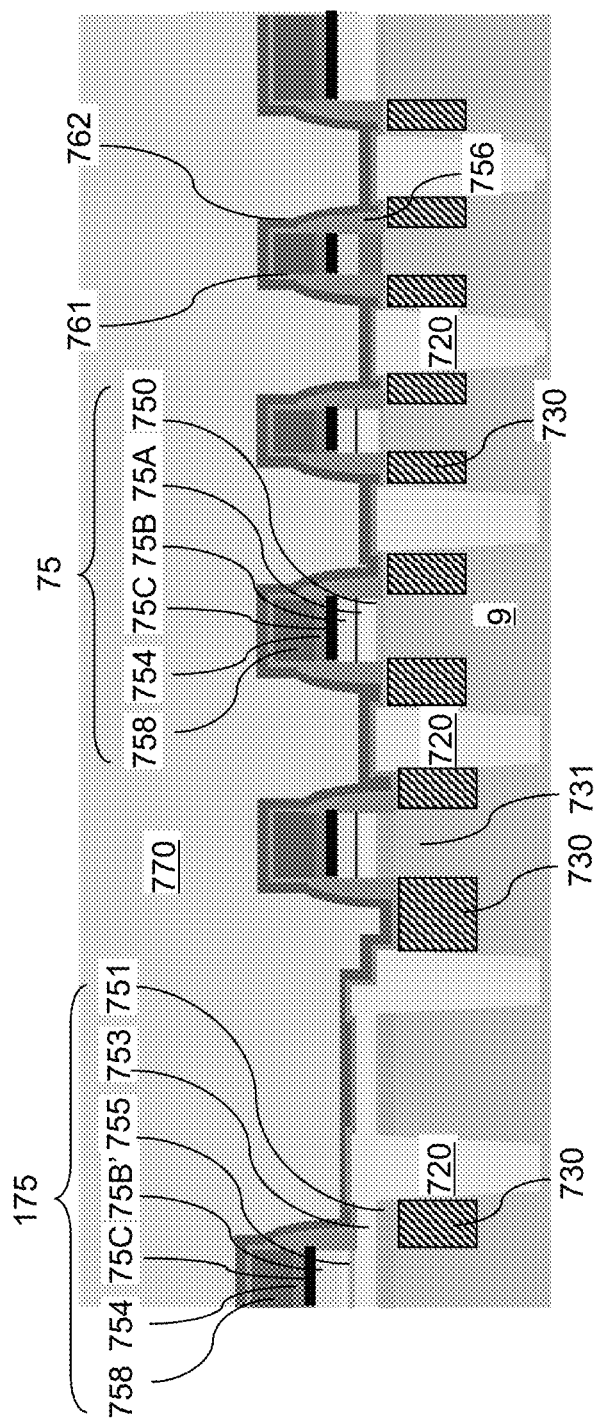
FIG. 8 is vertical cross-sectional view of the exemplary structure after formation of a planarization dielectric layer according to an embodiment of the present disclosure.

Referring to FIG. 8, a planarization dielectric layer 770 can be formed over the second dielectric liner 762. The planarization dielectric layer 770 includes a dielectric material that can be planarized by chemical mechanical planarization. For example, the planarization dielectric layer 770 can include undoped silicate glass, doped silicate glass, or organosilicate glass.

Figure 9:
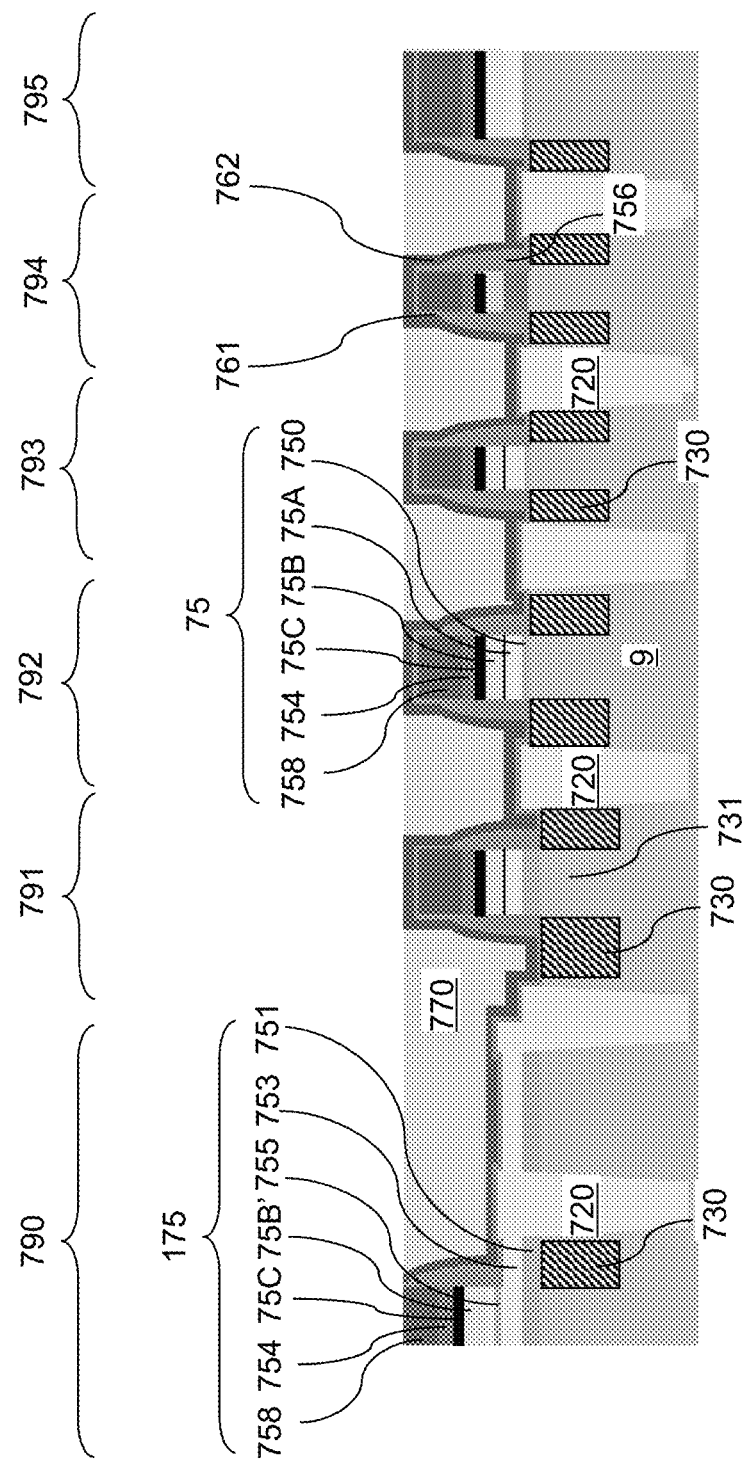
FIG. 9 is vertical cross-sectional view of the exemplary structure after planarization of the planarization dielectric layer according to an embodiment of the present disclosure.

Referring to FIG. 9, a chemical mechanical planarization (CMP) process can be performed to planarize the planarization dielectric layer 770. The second dielectric liner 762 and/or the silicon nitride gate cap portions 758 may be employed as stopping structures for the CMP process. The planarization dielectric layer 770 can have a planar top surface located within a same horizontal plane as top surfaces of the stopping structures after the planarization process. The flash memory gate structure 175 is located in charge storage transistors 790 of a memory register, and the transistor gate structures 75 can be located in respective high voltage transistors 791, low voltage transistors 792, n-type very low voltage transistors 793, p-type very low voltage transistors 794 and cell array transistors 795. The transistors 790-795 may comprise peripheral devices of a driver circuit for a three-dimensional NAND memory device described in more detain below.

Figure 10:
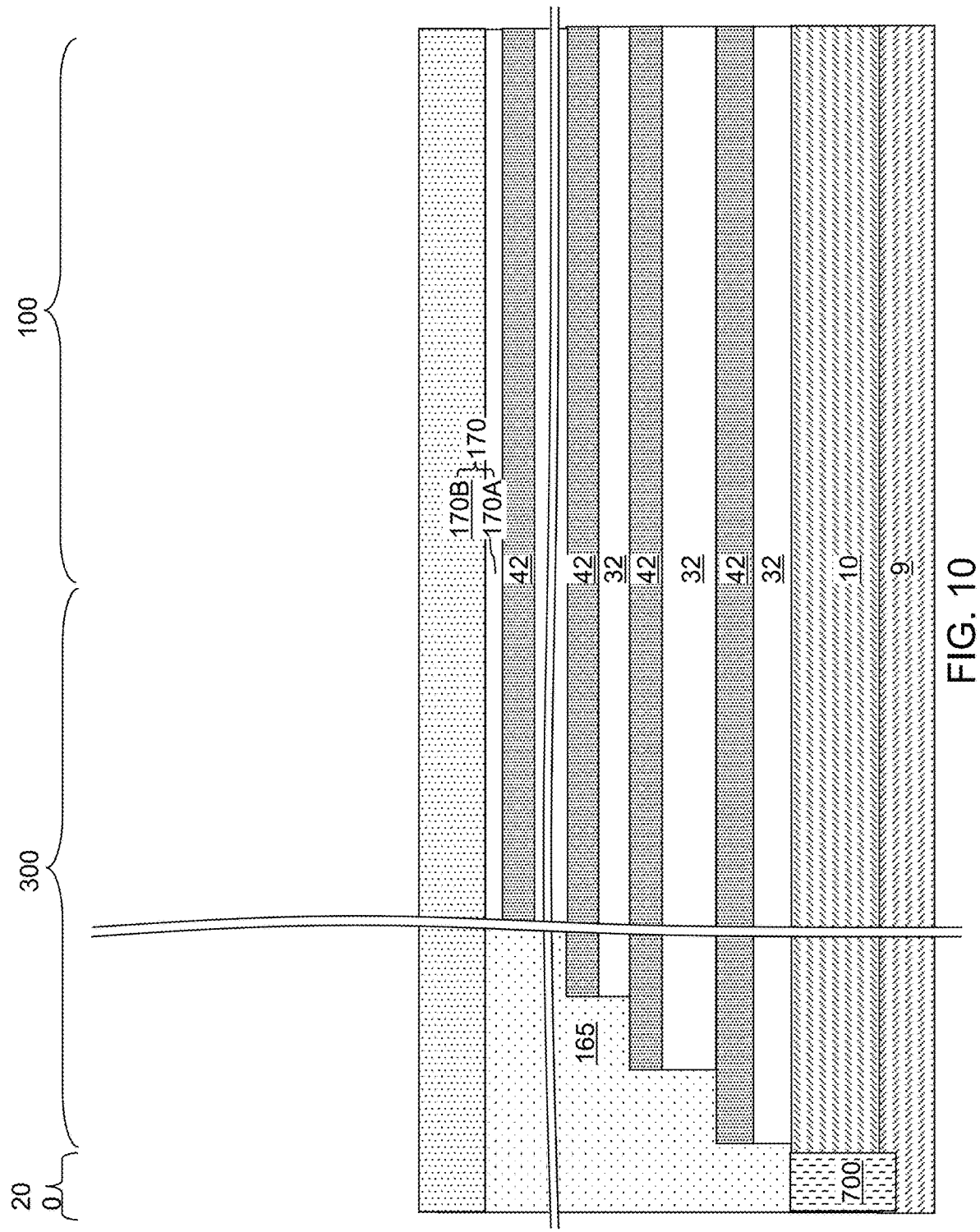
FIG. 10 is a vertical cross-sectional view of the exemplary structure after formation of a first-tier alternating stack of insulating layers and sacrificial material layers, a first inter-tier dielectric sublayer, first stepped surfaces, a retro-stepped dielectric material portion, and a second inter-tier dielectric sublayer according to an embodiment of the present disclosure.

Referring to FIG. 10, a stack of an alternating plurality of first material layers (which can be insulating layers 32) and second material layers (which can be sacrificial material layer 42) is formed over the top surface of the substrate (9, 10). As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as a first-tier alternating stack (32, 42). In one embodiment, the first-tier alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the first-tier alternating stack (32, 42) can have a uniform thickness that is substantially invariant within each respective sacrificial material layer 42. The combination of the first-tier alternating stack (32, 42) and the first retro-stepped dielectric material portion 165 is herein referred to as a first-tier structure.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, a first inter-tier dielectric sublayer 170A can be formed over the first-tier alternating stack (32, 42). As used herein, a "sublayer" refers to a component layer of a layer that includes at least two component layers. The first inter-tier dielectric sublayer 170A includes a dielectric material that is different from the material of the sacrificial material layers 42. In one embodiment, the first inter-tier dielectric sublayer 170A can include a dielectric material that can be employed for the insulating layers 32 as described above. The first inter-tier dielectric sublayer 170A can be deposited, for example, by chemical vapor deposition. In one embodiment, the insulating layers and the first inter-tier dielectric sublayer 170A can include undoped silicate glass.

First stepped surfaces are formed at a peripheral region of the first-tier alternating stack (32, 42) and the first inter-tier dielectric sublayer 170A, which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the first-tier alternating stack (32, 42) are removed through formation of the first stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the first-tier alternating stack (32, 42) laterally extends farther than any overlying sacrificial material layer 42 within the first-tier alternating stack (32, 42) in the terrace region. The terrace region includes first stepped surfaces of the first-tier alternating stack (32, 42) that continuously extend from a bottommost layer within the first-tier alternating stack (32, 42) to a topmost layer within the first-tier alternating stack (32, 42).

Each vertical step of the first stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A first retro-stepped dielectric material portion 165 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. If silicon oxide is employed for the first retro-stepped dielectric material portion 165, the silicon oxide of the first retro-stepped dielectric material portion 165 may, or may not, be doped with dopants such as B, P, and/or F.

A second inter-tier dielectric sublayer 170B can be formed over the first inter-tier dielectric sublayer 170A and the first retro-stepped dielectric material portion 165. The second inter-tier dielectric sublayer 170B includes a dielectric material that provides a higher etch rate than the materials of the insulating layers 32, the first inter-tier dielectric sublayer 170A, and the first retro-stepped dielectric material portion 165. In one embodiment, the insulating layers 32, the first inter-tier dielectric sublayer 170A, and the first retro-stepped dielectric material portion 165 can include undoped silicate glass, and the second inter-tier dielectric sublayer 170B can include a doped silicate glass such as borosilicate glass or borophosphosilicate glass. The thickness of the second-inter-tier dielectric sublayer 170B can be in a range from 50 nm to 200 nm, although lesser and greater thicknesses can also be employed. The combination of the first inter-tier dielectric sublayer 170A and the second inter-tier dielectric sublayer 170B constitutes an inter-tier dielectric layer 170.

Figure 11A:
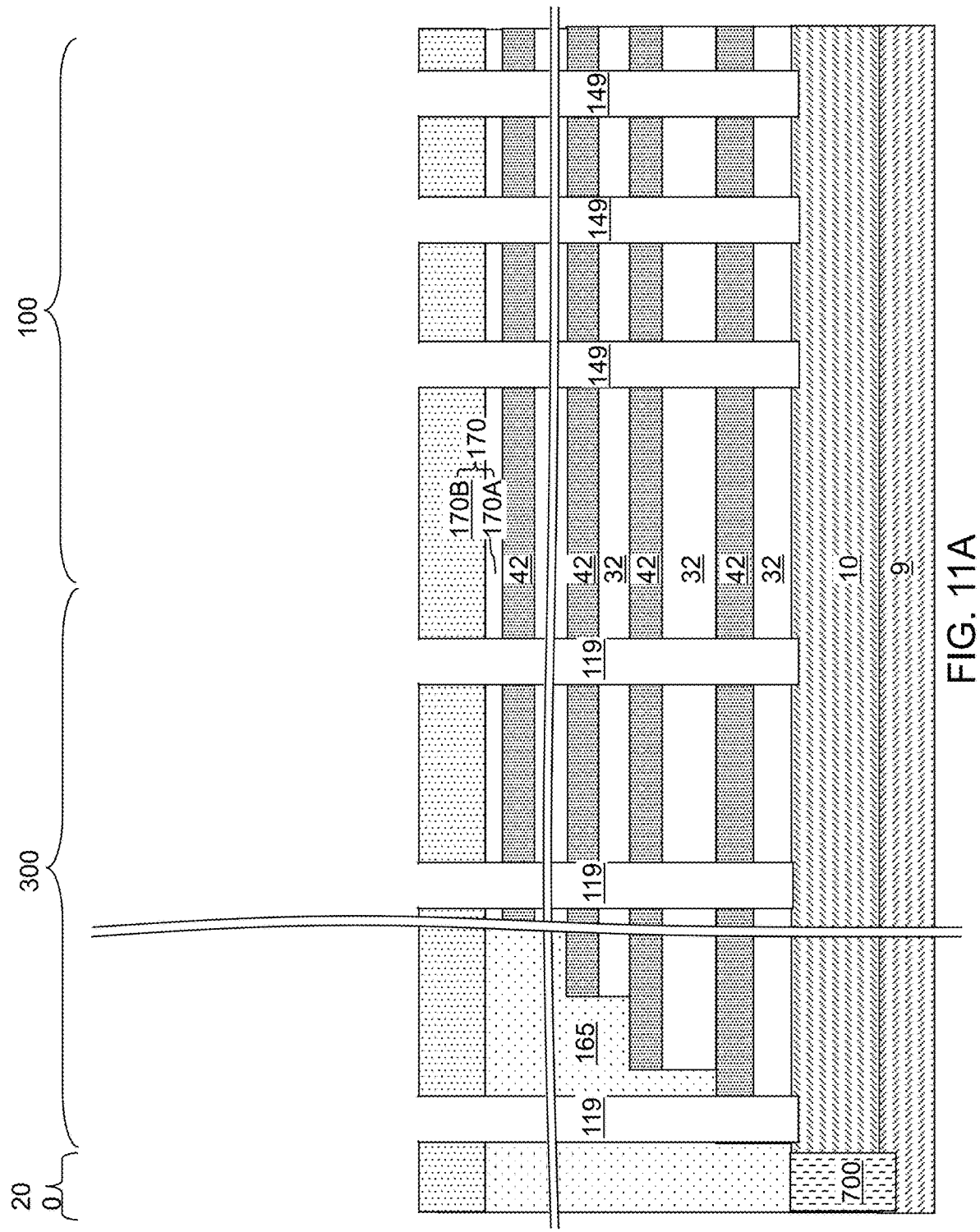
FIG. 11A is a vertical cross-sectional view of the exemplary structure after formation of first-tier memory openings and first-tier support openings according to an embodiment of the present disclosure.
Figure 11B:
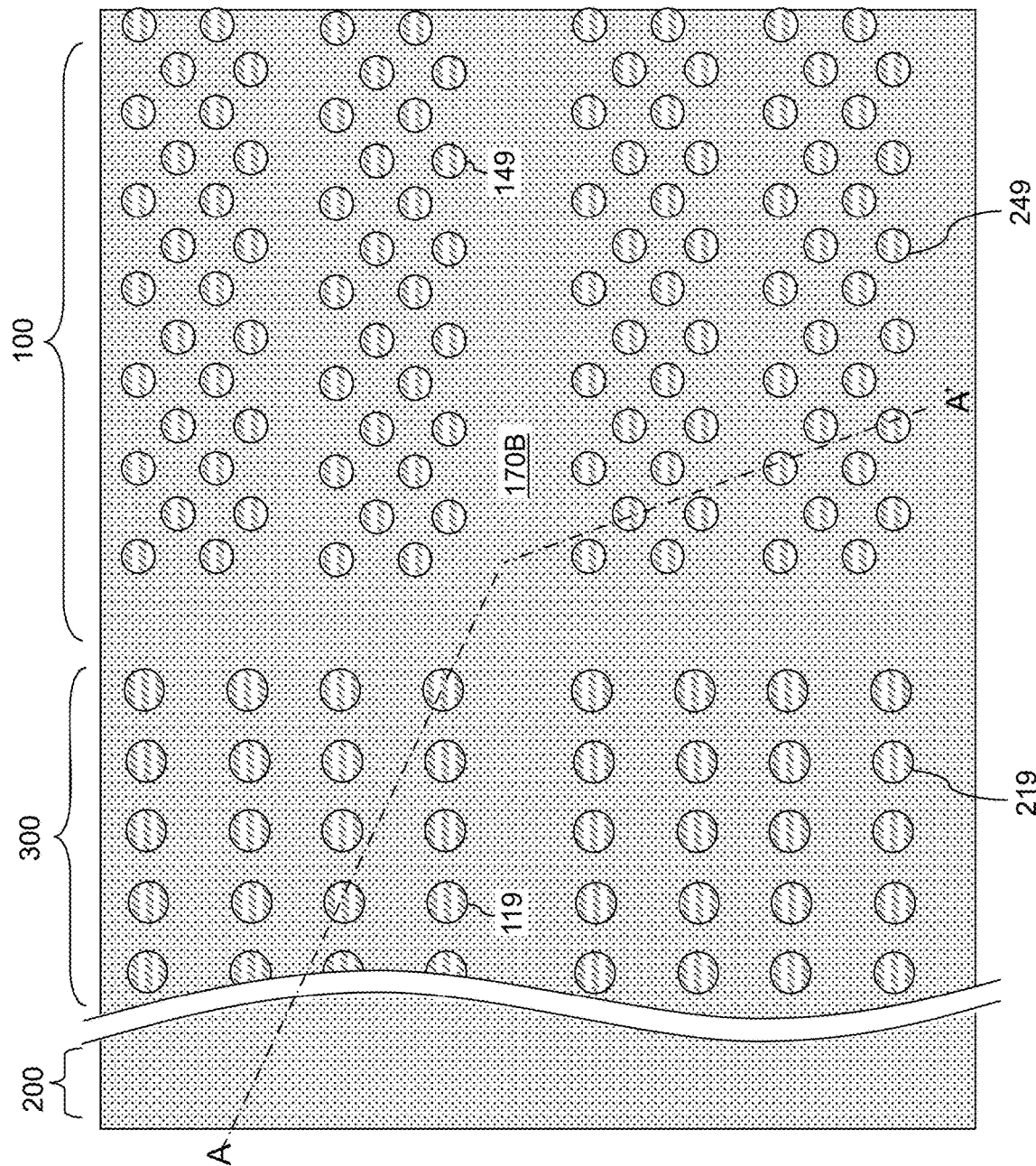
FIG. 11B is a top-down view of the exemplary structure of FIG. 11A.

Referring to FIGS. 11A and 11B, first-tier memory openings 149 and first-tier support openings 119 can be formed through the first-tier alternating stack (32, 42). The first-tier memory openings 149 can be formed in the memory array region 100, and the first-tier support openings 119 can be formed in the staircase region 300.

Figure 12:
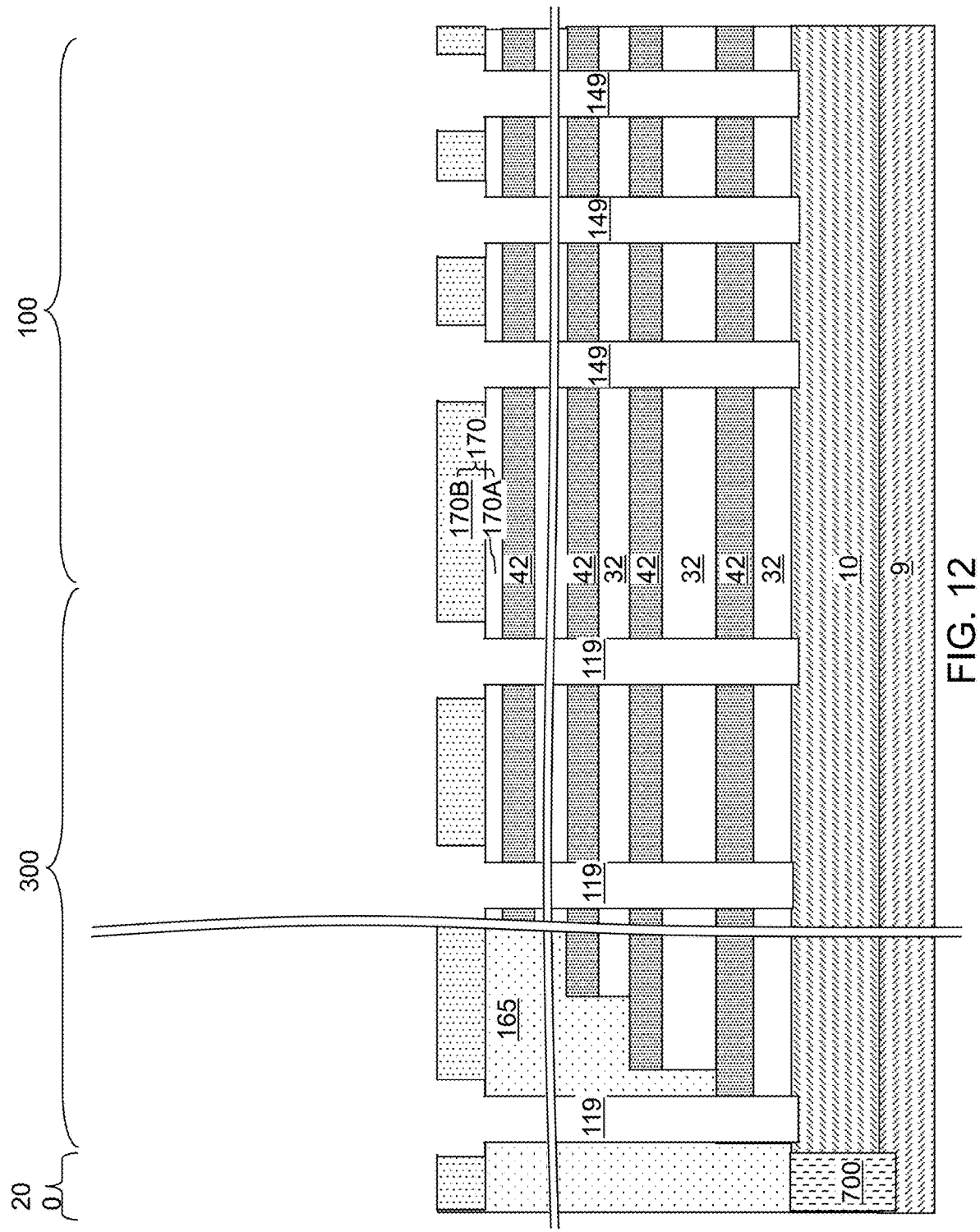
FIG. 12 is a vertical cross-sectional view of the exemplary structure after widening top portions of the first-tier memory openings and the first-tier support openings according to an embodiment of the present disclosure.

Referring to FIG. 12, an isotropic etch process can be performed to recess physically exposed surfaces of the second inter-tier dielectric sublayer 170B. Upper regions of the first-tier memory openings 149 and the first-tier support openings 119 are laterally expanded at the level of the second inter-tier dielectric sublayer 170B.

Figure 13:
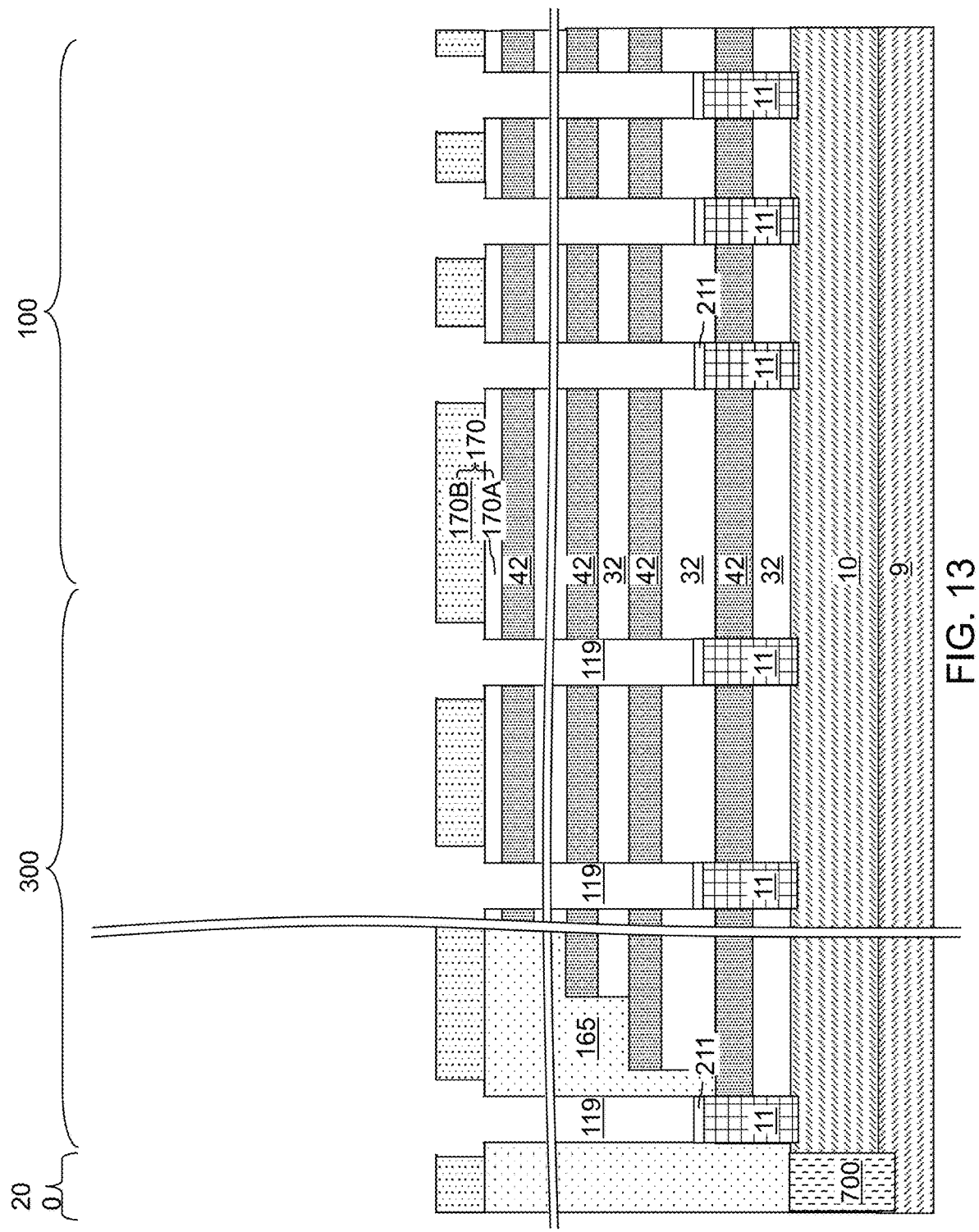
FIG. 13 is a vertical cross-sectional view of the exemplary structure after formation of pedestal channel portions and etch stop semiconductor oxide plates according to an embodiment of the present disclosure.

Referring to FIG. 13, a doped semiconductor material portion can be formed at the bottom portion of each first-tier memory opening 149 and each first-tier support openings 119 by a selective semiconductor deposition process. The doped semiconductor material portions are herein referred to as pedestal channel portions 11, which are employed as a portion of a respective semiconductor channel that vertically extends through a respective vertical stack of memory elements. For example, a selective epitaxy process can be employed to form the pedestal channel portions 11. In case the semiconductor material layer 10 includes a single crystalline semiconductor material, each pedestal channel portion 11 can comprise a single crystalline semiconductor material in epitaxial alignment with the single crystalline semiconductor material of the semiconductor material layer 10. In one embodiment, the top surface of each pedestal channel portion 11 can be formed above a horizontal plane including the top surface of a bottommost sacrificial material layer 42. In this case, a source select gate electrode can be subsequently formed by replacing the bottommost sacrificial material layer 42 with a conductive material layer. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

A surface oxidation process can be performed to convert top portions of the pedestal channel portions 11 into semiconductor oxide plates 211. The thickness of each semiconductor oxide plate 211 can be in a range from 2 nm to 12 nm, such as from 4 nm to 8 nm, although lesser and greater thicknesses can also be employed. In one embodiment, the semiconductor oxide plates 211 can include silicon oxide.

Figure 14:
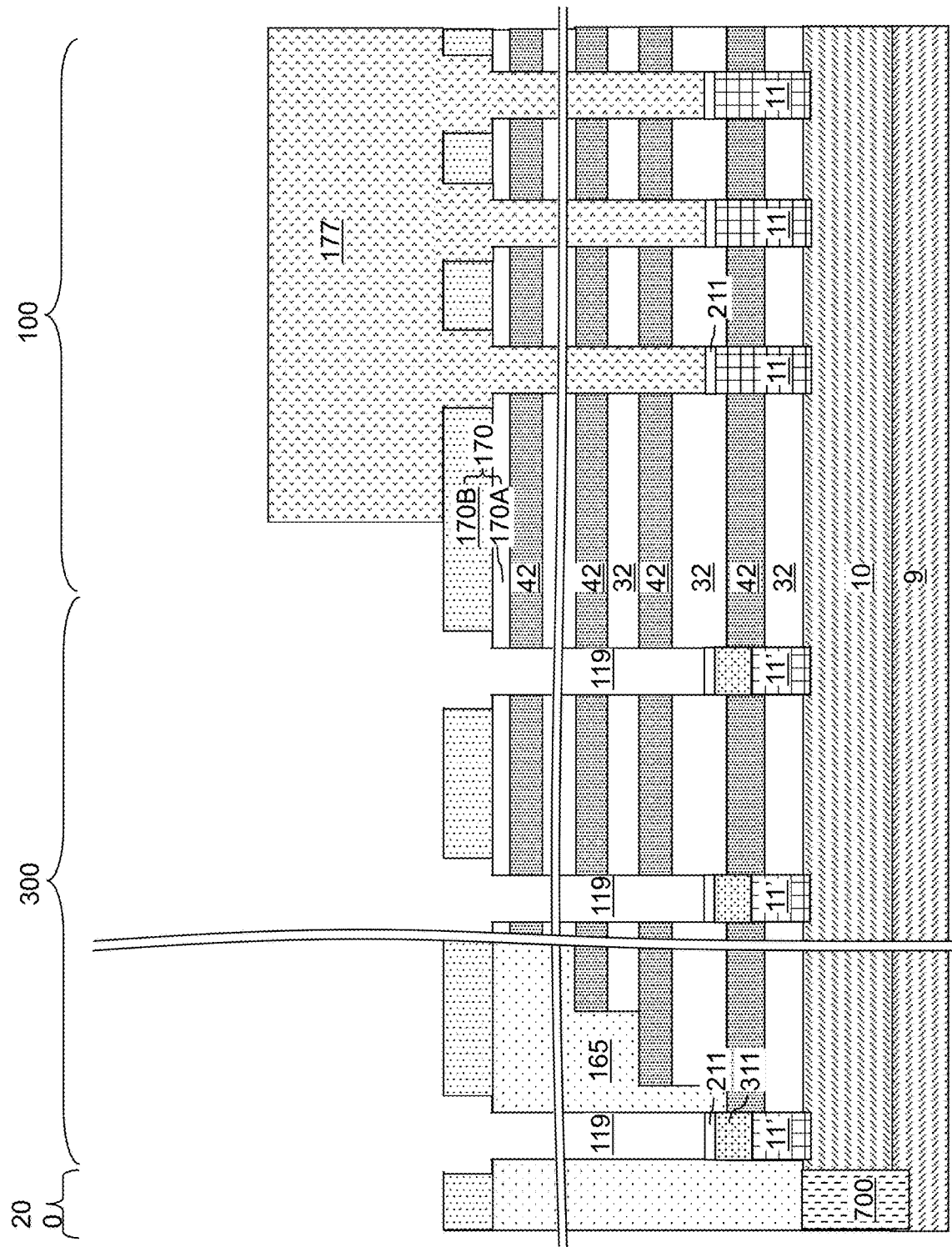
FIG. 14 is a vertical cross-sectional view of the exemplary structure after masked ion implantation of a dopant species into upper regions of pedestal channel portions within the first-tier support openings according to an embodiment of the present disclosure.

Referring to FIG. 14, a patterned masking layer 177 (such as a patterned photoresist layer) can be applied over the exemplary structure, and can be lithographically patterned to cover the memory array region 100 without covering the staircase region 2000. A dopant species can be implanted into upper segments of the pedestal channel portions 11 in the first-tier support openings 119 by an ion implantation process while the patterned masking layer 177 covers the pedestal channel portions 11 in the memory array region 100 and prevents implantation of the dopant species into the pedestal channel portions 11 in the memory array region 100. The patterned masking layer 177 can be subsequently removed, for example, by ashing.

The implanted segment of each pedestal channel portion 11 in the first-tier support openings 119 constitute an etch stop pedestal segment 311. The ion implantation energy can be 5 to 15 keV, such as 5 to 10 keV, and the implant does can be $1\times10^{15}$ cm$^{-2}$ to $1\times10^{16}$ cm$^{-2}$, such as $1\times10^{15}$ cm$^{-2}$ to $5\times10^{15}$ cm$^{-2}$. The thickness of each etch stop pedestal segment 311 can be in a range from 2 nm to 20 nm, such as 5 nm to 10 nm although lesser and greater thicknesses can also be employed. The dopant species can be an element that can impede etching of the semiconductor material the pedestal channel portions 11 during a subsequent etch process. For example, the pedestal channel portions 11 can include silicon, and the etch process can include TMY as the etching medium. In this case, the dopant species can include one or more of carbon, boron, nitrogen, or oxygen. Preferably, the dopant species include carbon and/or boron.

Lower segments of the pedestal channel portions 11 in the first-tier support openings 119 are not implanted with the dopant species during the ion implantation process, and are herein collectively referred to as the remaining pedestal segments 11'. The implanted upper segments of the pedestal channel portions 11 are referred to as the etch stop pedestal segments 311.

The material composition of the etch stop pedestal segments 311 differs from the material composition of an immediately underlying remaining pedestal segments 11' by presence of the implanted dopant species and/or by higher atomic concentration of the implanted species. In one embodiment, the etch stop pedestal segments 311 can include carbon, nitrogen, or oxygen, and the immediately underlying remaining pedestal segments 11' may be free of carbon, nitrogen, and/or oxygen. In another embodiment, the etch stop pedestal segments 311 can have a higher concentration of boron, carbon, oxygen or nitrogen atoms than the immediately underlying remaining pedestal segments 11'.

In one embodiment, the etch stop pedestal segments 311 can comprise the dopant species at an atomic concentration that is at least 20 times greater than an atomic concentration of the dopant species in the underlying remaining pedestal segments 11'. In one embodiment, the etch stop pedestal segments 311 and the remaining pedestal segments 11' can comprise silicon at an atomic concentration greater than 95% and an electrical dopant selected from a p-type dopant (e.g., boron) and/or a n-type dopant (e.g., phosphorus or arsenic) at a concentration in a range at a concentration in a range from $1\times10^{14}$/cm$^3$ to $1\times10^{18}$/cm$^3$.

The etch stop pedestal segments 311 also include a dopant species selected from C, B, N or O at a concentration in a range from $5\times10^{19}$/cm$^3$ to $5\times10^{21}$/cm$^3$. In one embodiment, the remaining pedestal segments 11' in the first-tier support openings 119 and the pedestal channel portions 11 in the first-tier memory openings 149 contain no dopant species selected from C, O or N or at least 5 times less, such as at least 20 times less, of the dopant species selected from C, B, O or N. For example, the remaining pedestal segments 11' in the first-tier support openings 119 and the pedestal channel portions 11 in the first-tier memory openings 149 contain dopant species selected from C, B, O or N at a concentration of less than $1\times10^{19}/cm^3$, including less than $1\times10^{18}/cm^3$ such as zero to $1\times10^{18}/cm^3$, for example $1\times10^{12}/cm^3$ to $1\times10^{18}/cm^3$.

In one embodiment, the remaining pedestal segments 11' in the first-tier support openings 119 and the pedestal channel portions 11 in the first-tier memory openings 149 can be free of the dopant species, or include the dopant species at an atomic concentration that is less than 0.05 times an atomic concentration of the dopant species within the etch stop pedestal segments 311. In one embodiment, the concentration of the dopant species in the etch stop pedestal segments 311 provides a significant increase in the etch resistance to the TMY etch chemistry for etching silicon. For example, the etch stop pedestal segments 311 have an etch rate than is at least 5 times less, such as at least 20 times less, such as 20 to 100 times less, in TMY than the remaining pedestal segments 11' in the first-tier support openings 119 and the pedestal channel portions 11 in the first-tier memory openings 149

The pedestal channel portions 11 in the memory array region 100 are herein referred to as memory opening pedestal channel portions 11 or first pedestal channel portions. Each vertical stack of a remaining pedestal segment 11' and an etch stop pedestal segment 311 constitutes pedestal channel portion, which is herein referred to as a support pillar pedestal channel portion (11', 311) or a second pedestal channel portion. Each support pillar pedestal channel portion (11', 311) (i.e., each second pedestal channel portion) comprises an etch stop pedestal segment 311 including a dopant species selected from carbon, boron, nitrogen, or oxygen, and a remaining pedestal segment 11' including the first doped semiconductor material. The memory opening pedestal channel portions 11 (i.e., the first pedestal channel portions) can consists of the first doped semiconductor material. Thus, the memory opening pedestal channel portions 11 can include, and/or consist of, the first doped semiconductor material that free of the dopant species or including the dopant species at an atomic concentration that is less than 0.05 times an atomic concentration of the dopant species within the etch stop pedestal segment 311.

Figure 15:
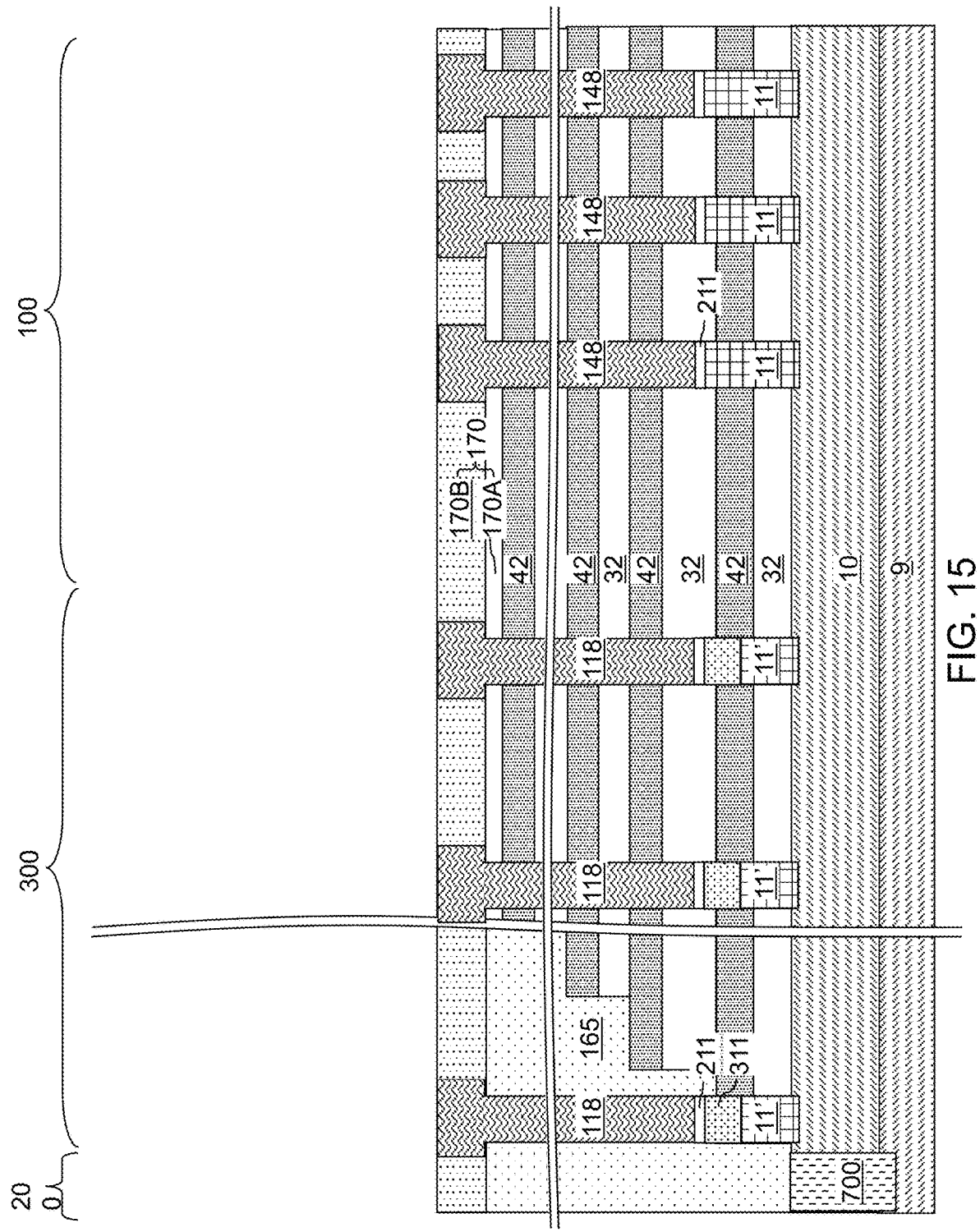
FIG. 15 is a vertical cross-sectional view of the exemplary structure after formation of sacrificial fill structures according to an embodiment of the present disclosure.

Referring to FIG. 15, is a sacrificial fill material is deposited in remaining volumes of the first-tier memory openings 149 and the first-tier support openings 119. The sacrificial fill material includes a material that can be removed selective to the materials of the insulating layers 32, the sacrificial material layers 42, and the semiconductor oxide plates 211. For example, the sacrificial fill material can include amorphous silicon. Excess portions of the semiconductor fill material can be removed from above the top surface of the inter-tier dielectric layer 170 by a planarization process, which can employ a recess etch and/or chemical mechanical planarization (CMP). Remaining portion of the sacrificial fill material constitutes sacrificial fill structures, which include sacrificial memory opening fill structures 148 filling the first-tier memory openings 149 and sacrificial support opening fill structures 118 filling the first-tier support openings 119. The sacrificial memory opening fill structures 148 and the sacrificial support opening fill structures 118 are formed concurrently, and include the same sacrificial fill material. A sacrificial support opening fill structure 118 overlies a support pillar pedestal channel portion (11', 311) within each first-tier support openings 119. A sacrificial memory opening fill structure 148 overlies a memory opening pedestal channel portion 11 within each first-tier memory opening 149.

Figure 16A:
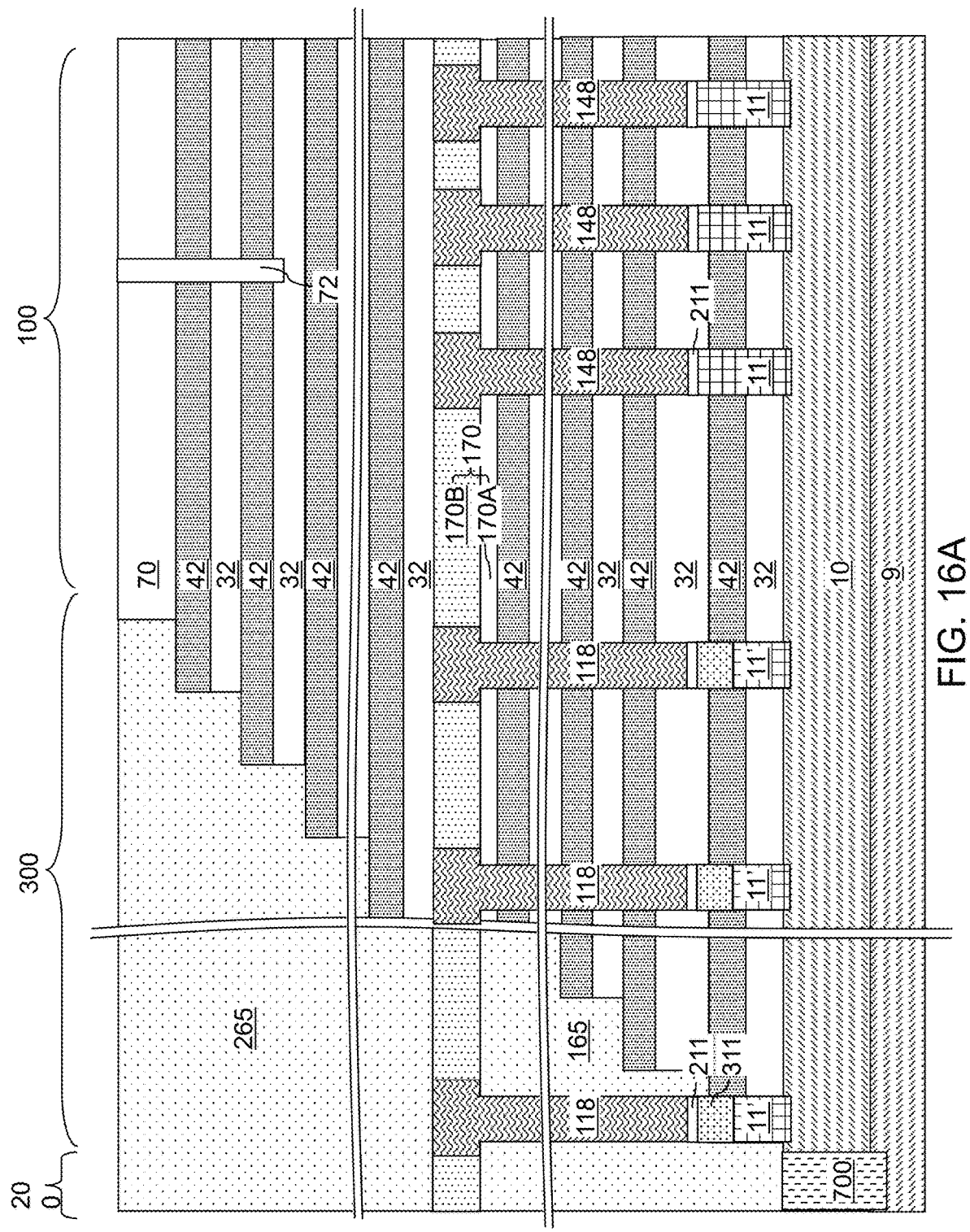
FIG. 16A is a vertical cross-sectional view of the exemplary structure after formation of a second-tier alternating stack of insulating layers and spacer material layers, second stepped surfaces, and a second retro-stepped dielectric material portion according to an embodiment of the present disclosure.
Figure 16B:
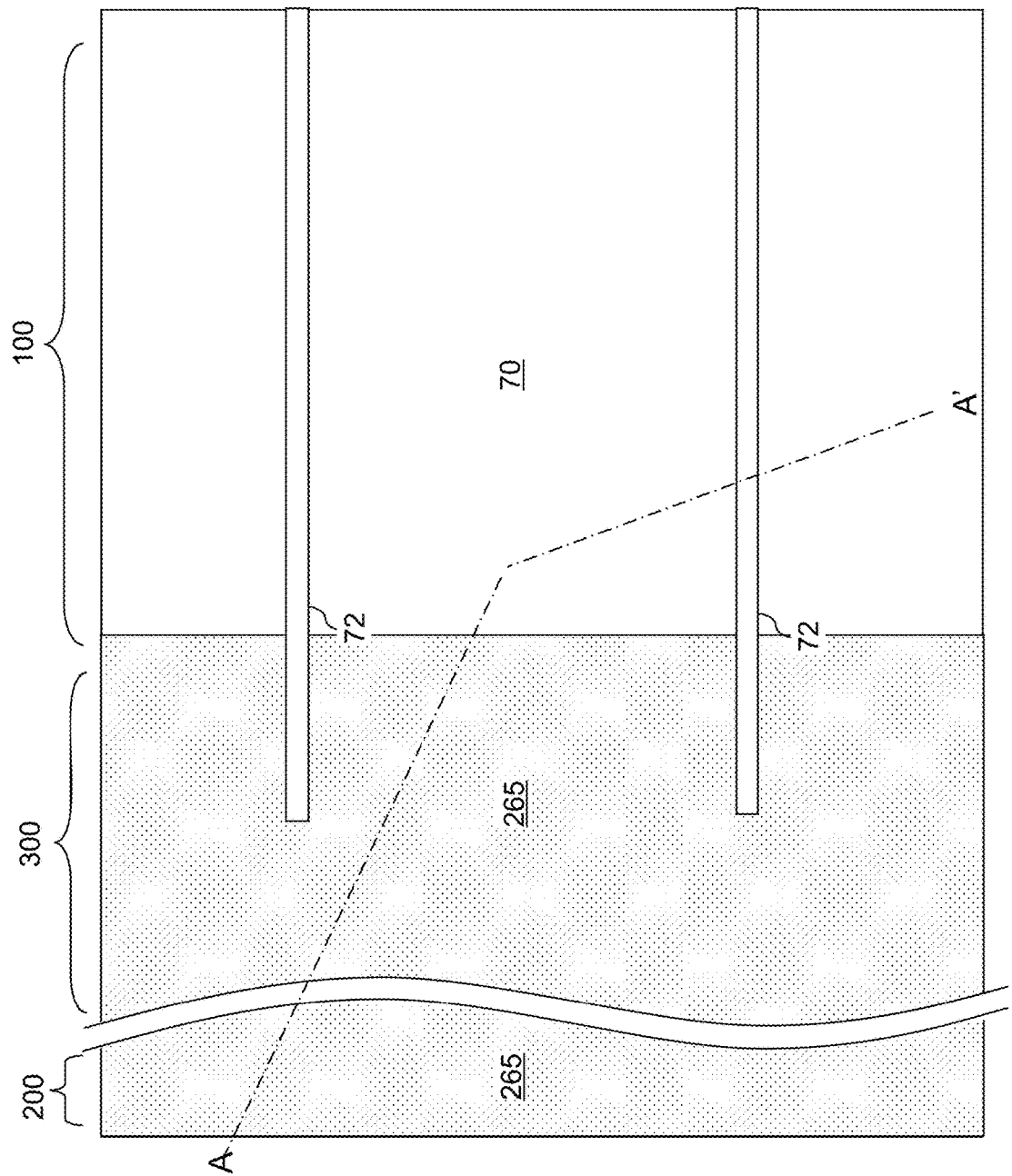
FIG. 16B is a horizontal cross-sectional of the exemplary structure along the horizontal plane B-B' of FIG. 16A. The hinged vertical plane A-A' corresponds to the plane of the vertical cross-sectional view of FIG. 16A.

Referring to FIGS. 16A and 16B, a second-tier structure can be formed over the inter-tier dielectric layer 170. The second-tier structure can include an alternating stack of additional insulating layers 32 and additional spacer material layers which can be additional sacrificial material layers 42. The additional stack is herein referred to as a second-tier alternating stack (32, 42). The thicknesses of the insulating layers 32 and the sacrificial material layers 42 in the second-tier alternating stack (32, 42) can be in a range from 20 nm to 50 nm, although lesser and greater thicknesses can be employed. The number of repetitions of the pairs of an insulating layer 32 and a sacrificial material layer 42 within the second-tier alternating stack (32, 42) can be in a range from 2 to 1,024, and typically from 8 to 256, although a greater number of repetitions can also be employed.

An insulating cap layer 70 can be subsequently formed over the second-tier alternating stack (32, 42). The insulating cap layer 70 can include the same material as the insulating layers 32, and can have a greater thickness than each of the insulating layers 32.

Second stepped surfaces in the second stepped area can be formed in the staircase region 300 by patterning the insulating cap layer 70 and the second-tier alternating stack (32, 42). A same set of processing steps may be employed mutatis mutandis as the processing steps employed to form the first stepped surfaces in the first stepped area with suitable adjustment to the pattern of at least one masking layer. A second retro-stepped dielectric material portion 265 can be formed over the second stepped surfaces in the staircase region 300.

Generally speaking, at least one alternating stack of insulating layers 32 and spacer material layers (such as sacrificial material layers 42) can be formed over the substrate (9, 10), and at least one retro-stepped dielectric material portion (165, 265) can be formed over the stepped surfaces on the at least one alternating stack (32, 42).

Optionally, drain-select-level isolation structures 72 can be formed through a subset of layers in an upper portion of the second-tier alternating stack (32, 42). The sacrificial material layers 42 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 can laterally extend along a first horizontal direction hd1, and can be laterally spaced apart along a second horizontal direction hd2 that is perpendicular to the first horizontal direction hd1. The combination of the second-tier alternating stack (32, 42), the second retro-stepped dielectric material portion 265, the insulating cap layer 70, and the optional drain-select-level isolation structures 72 collectively constitute a second-tier structure (32, 42, 265, 70, 72).

Figure 17A:
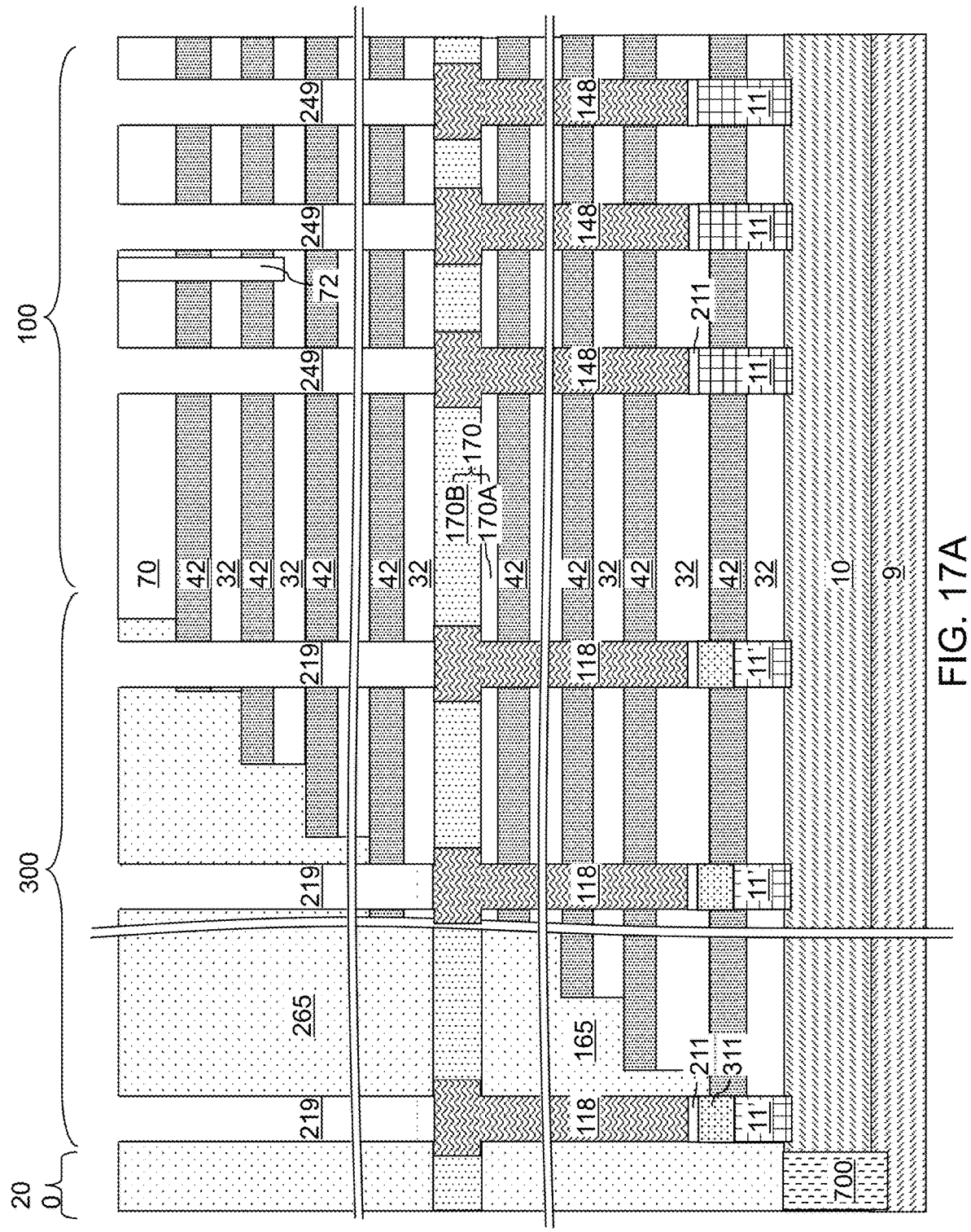
FIG. 17A is a vertical cross-sectional view of the exemplary structure after formation of second-tier memory openings and second-tier support openings according to an embodiment of the present disclosure.
Figure 17B:
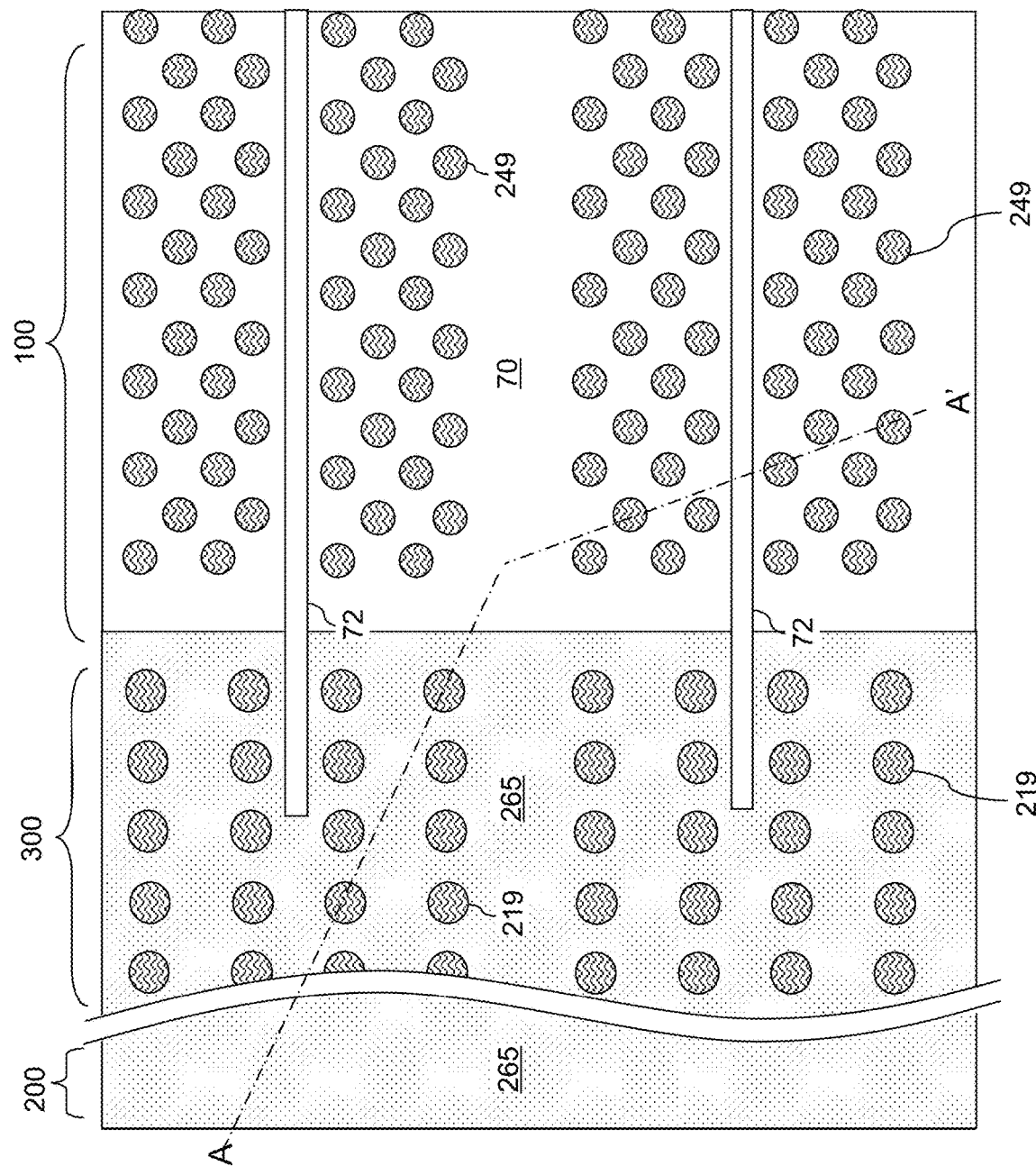
FIG. 17B is a horizontal cross-sectional of the exemplary structure along the horizontal plane B-B' of FIG. 17A. The hinged vertical plane A-A' corresponds to the plane of the vertical cross-sectional view of FIG. 17A.

Referring to FIGS. 17A and 17B, various second-tier openings (249, 219) can be formed through the second-tier structure (32, 42, 265, 70, 72). A photoresist layer (not shown) can be applied over the insulating cap layer 70, and can be lithographically patterned to form various openings therethrough. The pattern of the openings can be the same as the pattern of the various first-tier openings (149, 119), which is the same as the pattern for the sacrificial opening fill structures (148, 118). Thus, the lithographic mask employed to pattern the first-tier openings (149, 119) can be employed to pattern the photoresist layer.

The pattern of openings in the photoresist layer can be transferred through the second-tier structure (32, 42, 265, 70, 72) by a second anisotropic etch process to form various second-tier openings (249, 219) concurrently, i.e., during the second anisotropic etch process. The various second-tier openings (249, 219) can include second-tier memory openings 249 and second-tier support openings 219.

The second-tier memory openings 249 are formed directly on a top surface of a respective one of the sacrificial memory opening fill structures 148. The second-tier support openings 219 are formed directly on a top surface of a respective one of the sacrificial support opening fill structures 118. The second anisotropic etch process can include an etch step in which the materials of the second-tier alternating stack (32, 42) are etched concurrently with the material of the second retro-stepped dielectric material portion 265. The chemistry of the etch step can alternate to optimize etching of the materials in the second-tier alternating stack (32, 42) while providing a comparable average etch rate to the material of the second retro-stepped dielectric material portion 265. The second anisotropic etch process can employ, for example, a series of reactive ion etch processes or a single reaction etch process (e.g., $CF_4/O_2/Ar$ etch). The sidewalls of the various second-tier openings (249, 219) can be substantially vertical, or can be tapered. A bottom periphery of each second-tier opening (249, 219) may be laterally offset, and/or may be located entirely within, a periphery of a top surface of an underlying sacrificial opening fill structure (148, 118). The photoresist layer can be subsequently removed, for example, by ashing.

Figure 18:
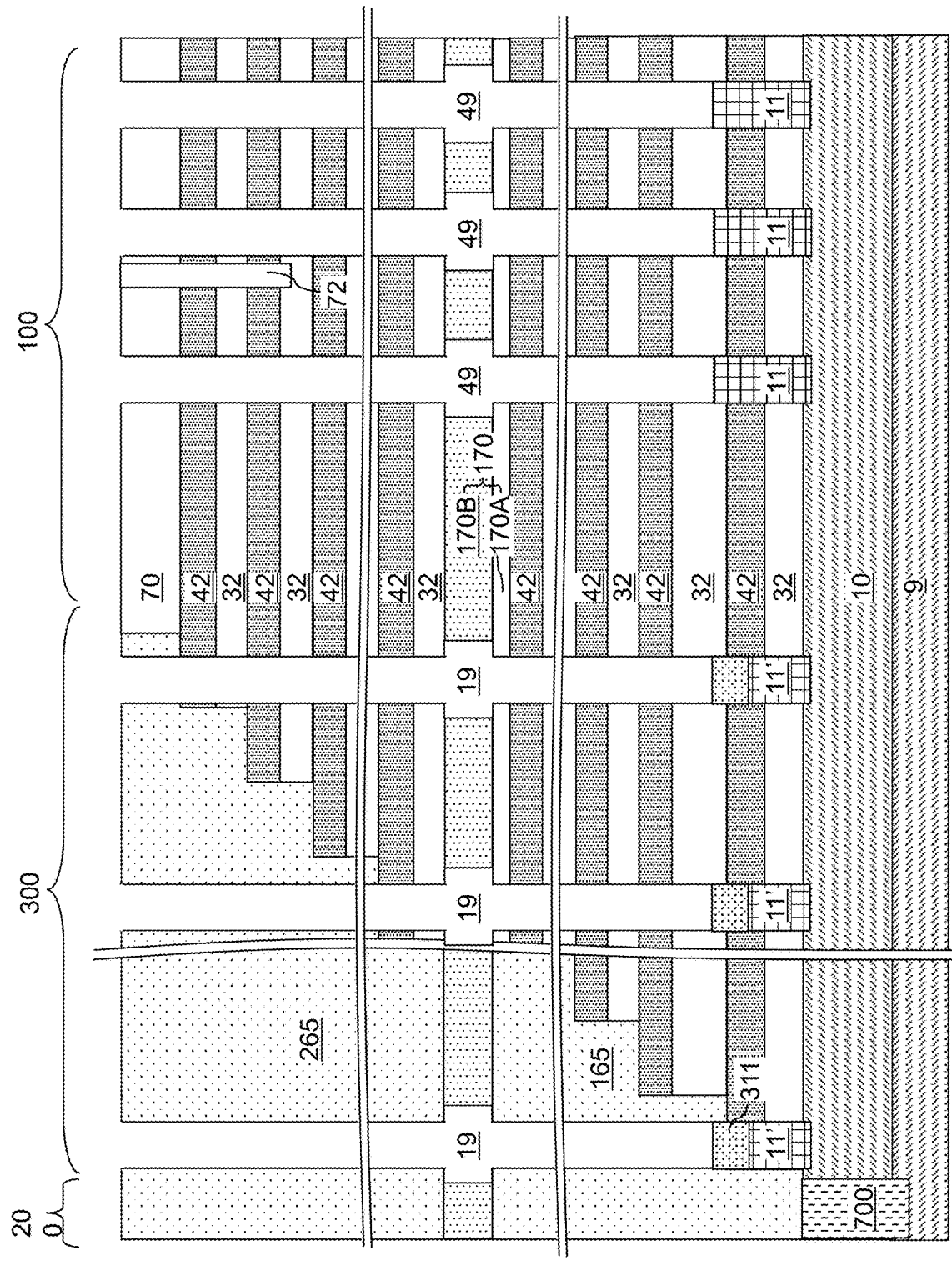
FIG. 18 is a vertical cross-sectional view of the exemplary structure after formation of inter-tier memory openings and inter-tier support openings according to an embodiment of the present disclosure.

Referring to FIG. 18, the sacrificial opening fill structure (148, 118) can be removed selective to the materials of the insulating layers 32, the sacrificial material layers 42, and the semiconductor oxide plates 211 (shown in FIG. 17A). In one embodiment, the sacrificial opening fill structure (148, 118) include amorphous silicon, and removal of the sacrificial opening fill structure (148, 118) can be performed by an isotropic etch process. In one embodiment, the isotropic etch process can include a wet etch process employing hot trimethyl-2 hydroxyethyl ammonium hydroxide ("hot TMY") or tetramethyl ammonium hydroxide (TMAH).

TMY or TMAH removes amorphous silicon selective to silicon oxide and silicon nitride. However, selectivity of the wet etch process employing TMY or TMAH for etching amorphous silicon does not provide infinite selectivity relative to silicon oxide. Collateral etching of silicon oxide by the wet etch process removes the semiconductor oxide plates 211, and laterally recesses physically exposed surfaces of the insulating layers 32 and the sacrificial material layers 42. The etch stop pedestal segments 311 increase etch resistance to the wet etch process employing TMY or TMAH. Thus, collateral etching of the support pillar pedestal channel portion (11', 311) during removal of the sacrificial opening fill structure (148, 118) and the semiconductor oxide plates 211 is avoided or reduced. In some embodiments, the semiconductor oxide plates 211 are not removed while the sacrificial opening fill structures (148, 118) are removed and retained in the device, as shown for example in FIG. 20B, which is described in more detail below. Thus, collateral etching of the support pillar pedestal channel portion (11', 311) during removal of the sacrificial opening fill structure (148, 118) is avoided or reduced.

Memory openings 49 are formed in the memory array region 100, and support openings 19 are formed in the staircase region 300. Each memory opening 49 includes a combined volume of a first-tier memory opening 149, a second-tier memory opening 249, and a semiconductor oxide plate 211. A support opening 19 includes a combined volume of a first-tier support opening 119, a second-tier support opening 219, and a semiconductor oxide plate 211.

FIGS. 19A-19H illustrate structural changes in a memory opening 49, which is one of the memory openings 49 in the exemplary structure of FIG. 18. The same structural change occurs simultaneously in each of the other memory openings 49 and in each of the support openings 19.

Referring to FIG. 19A, a memory opening 49 in the exemplary device structure of FIG. 18 is illustrated. The memory opening 49 extends through the insulating cap layer 70, the alternating stacks (32, 42), and the inter-tier dielectric layer 170, and to a top surface of a pedestal channel portion 11.

Referring to FIG. 19B, a layer stack including an optional outer blocking dielectric layer 51, an inner blocking dielectric layer 52, a charge storage layer 54, and a tunneling dielectric layer 56 can be sequentially deposited in each memory openings 49 and in each support opening 19. The layer stack of the optional outer blocking dielectric layer 51, the inner blocking dielectric layer 52, the charge storage layer 54, and the tunneling dielectric layer 56 constitutes a memory film 50.

The optional outer blocking dielectric layer 51 can include a dielectric metal oxide material such as aluminum oxide. The optional outer blocking dielectric layer 51 can be deposited by a conformal deposition process, and can have a thickness in a range from 1 nm to 10 nm, such as from 2 nm to 6 nm, although lesser and greater thicknesses can also be employed.

The inner blocking dielectric layer 52 can include silicon oxide. The inner blocking dielectric layer 52 can be deposited by a conformal deposition process, and can have a thickness in a range from 1 nm to 10 nm, such as from 2 nm to 6 nm, although lesser and greater thicknesses can also be employed.

The charge storage layer 54 can be deposited on the inner blocking dielectric layer 52. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

Referring to FIG. 19C, an optional first semiconductor channel layer 601 can be deposited by a conformal deposition process. The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (51, 52, 54, 56, 601).

Referring to FIG. 19D, the optional first semiconductor channel layer 601, the tunneling dielectric layer 56, the charge storage layer 54, the inner blocking dielectric layer 52, and the optional outer blocking dielectric layer 51 are sequentially anisotropically etched employing at least one anisotropic etch process. The portions of the first semiconductor channel layer 601, the tunneling dielectric layer 56, the charge storage layer 54, the inner blocking dielectric layer 52, and the optional outer blocking dielectric layer 51 located above the top surface of the insulating cap layer 70 can be removed by the at least one anisotropic etch process. Further, the horizontal portions of the first semiconductor channel layer 601, the tunneling dielectric layer 56, the charge storage layer 54, the inner blocking dielectric layer 52, and the optional outer blocking dielectric layer 51 at a bottom of each memory cavity 49' can be removed to form openings in remaining portions thereof. Each of the first semiconductor channel layer 601, the tunneling dielectric layer 56, the charge storage layer 54, the inner blocking dielectric layer 52, and the optional outer blocking dielectric layer 51 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, the inner blocking dielectric layer 52, and the optional outer blocking dielectric layer 51. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. Each patterned portion of the memory film 50 includes a plurality of charge storage regions (as embodied as the charge storage layer 54) that are insulated from surrounding materials by the blocking dielectric layers (52, 51) and the tunneling dielectric layer 56. In one embodiment, the first semiconductor channel layer 601, the tunneling dielectric layer 56, the charge storage layer 54, the inner blocking dielectric layer 52, and the optional outer blocking dielectric layer 51 can have vertically coincident sidewalls. In some embodiments, after the formation of memory cavity 49', the first semiconductor channel layer 601 is removed by TMY or TMAH. In this case, the first semiconductor channel layer 601 is a sacrificial semiconductor layer.

Figure 19F:
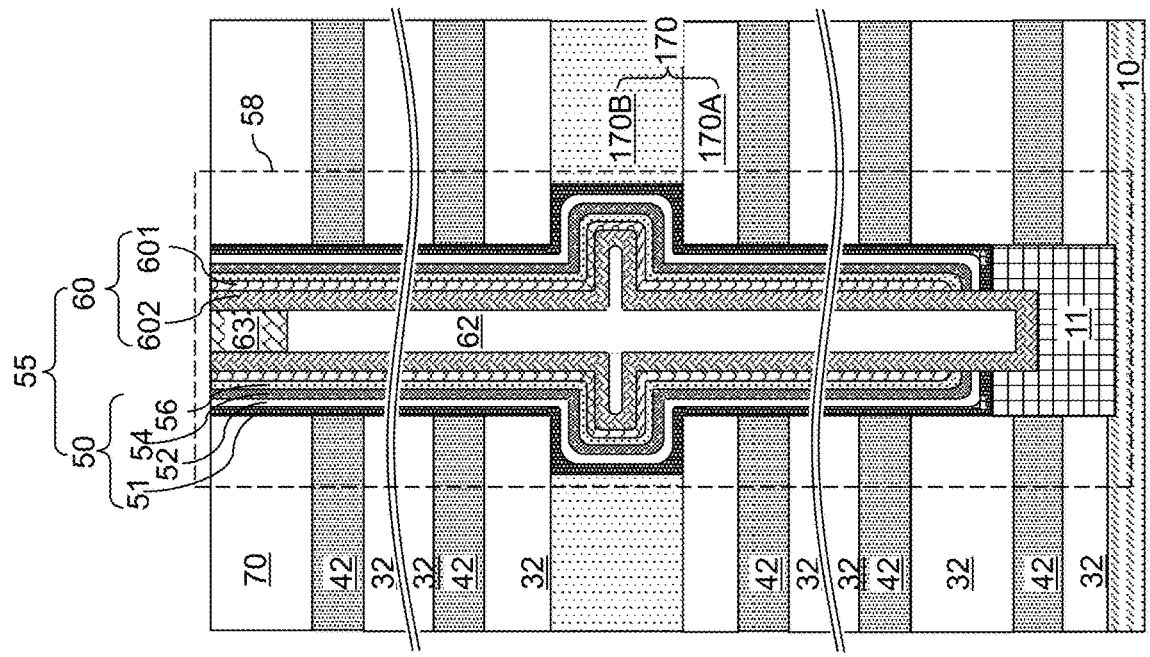
Figure 19E:
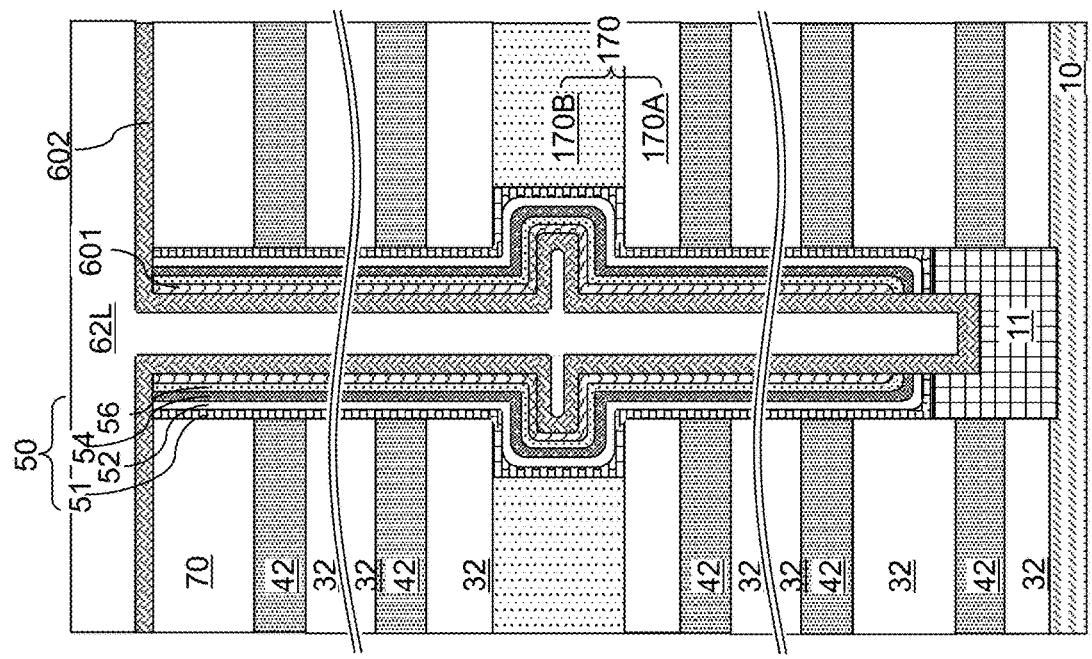

Referring to FIG. 19E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602. In case the first semiconductor channel layer 601 is not present, then the second semiconductor channel layer 602 is referred to as a semiconductor channel material.

A dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 19F, the dielectric core layer 62L can be recessed by a recess etch such that top surfaces of the remaining portions of the dielectric core layer 62L are formed below the horizontal plane including the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirely within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each contiguous set of blocking dielectric layers (51, 52), a charge storage layer 54, and a tunneling dielectric layer 56 collectively constitute a memory film 50, which can store electrical charges with a macroscopic retention time. In some embodiments, an outer blocking dielectric layer 51 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5 \times 10^{19}/cm^3$ to $2 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and blocking dielectric layers (51, 52). Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 20A:
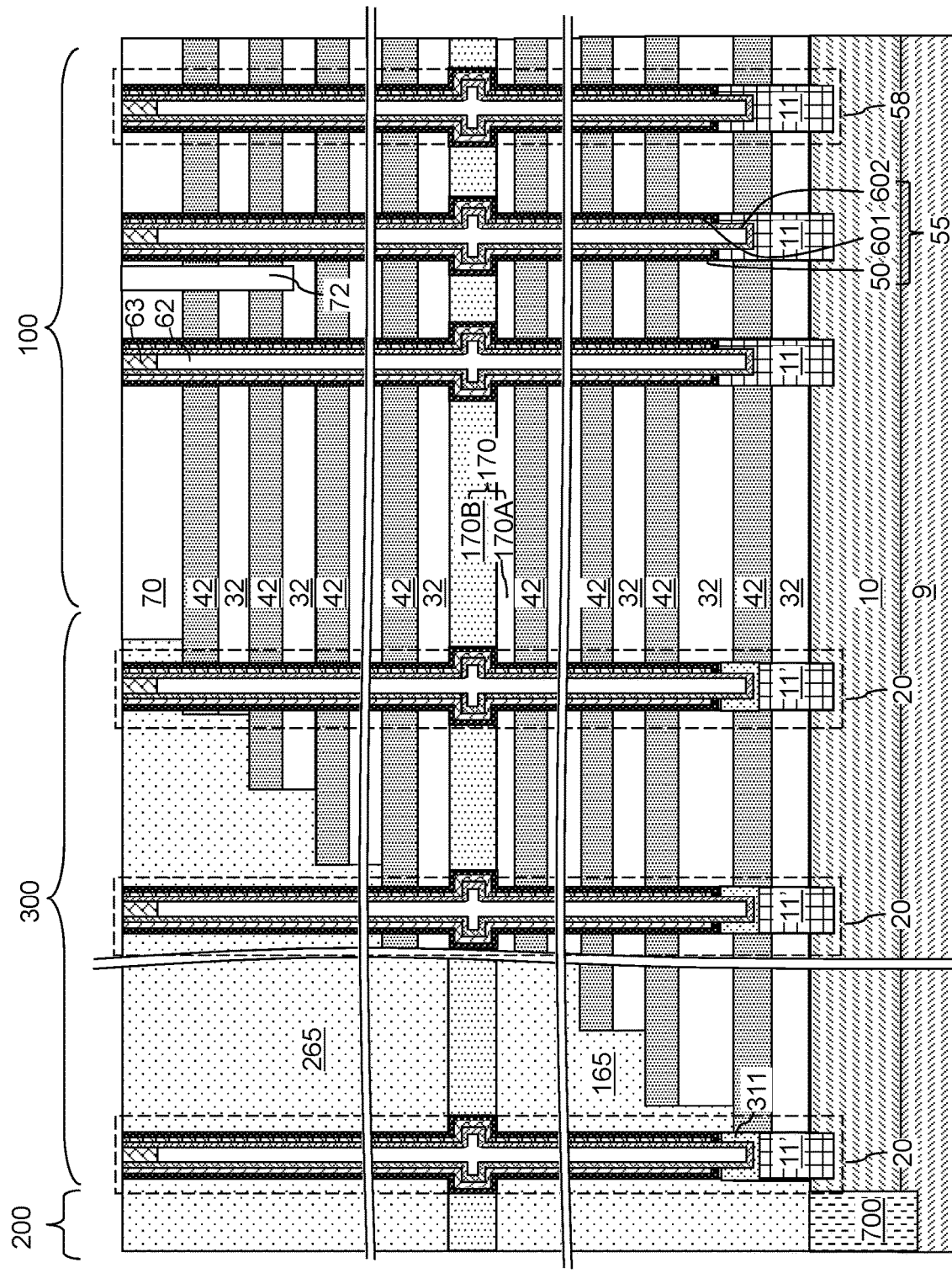
FIG. 20A is a vertical cross-sectional view of the exemplary structure after formation of memory opening fill structures and support pillar structures according to an embodiment of the present disclosure.
Figure 20B:
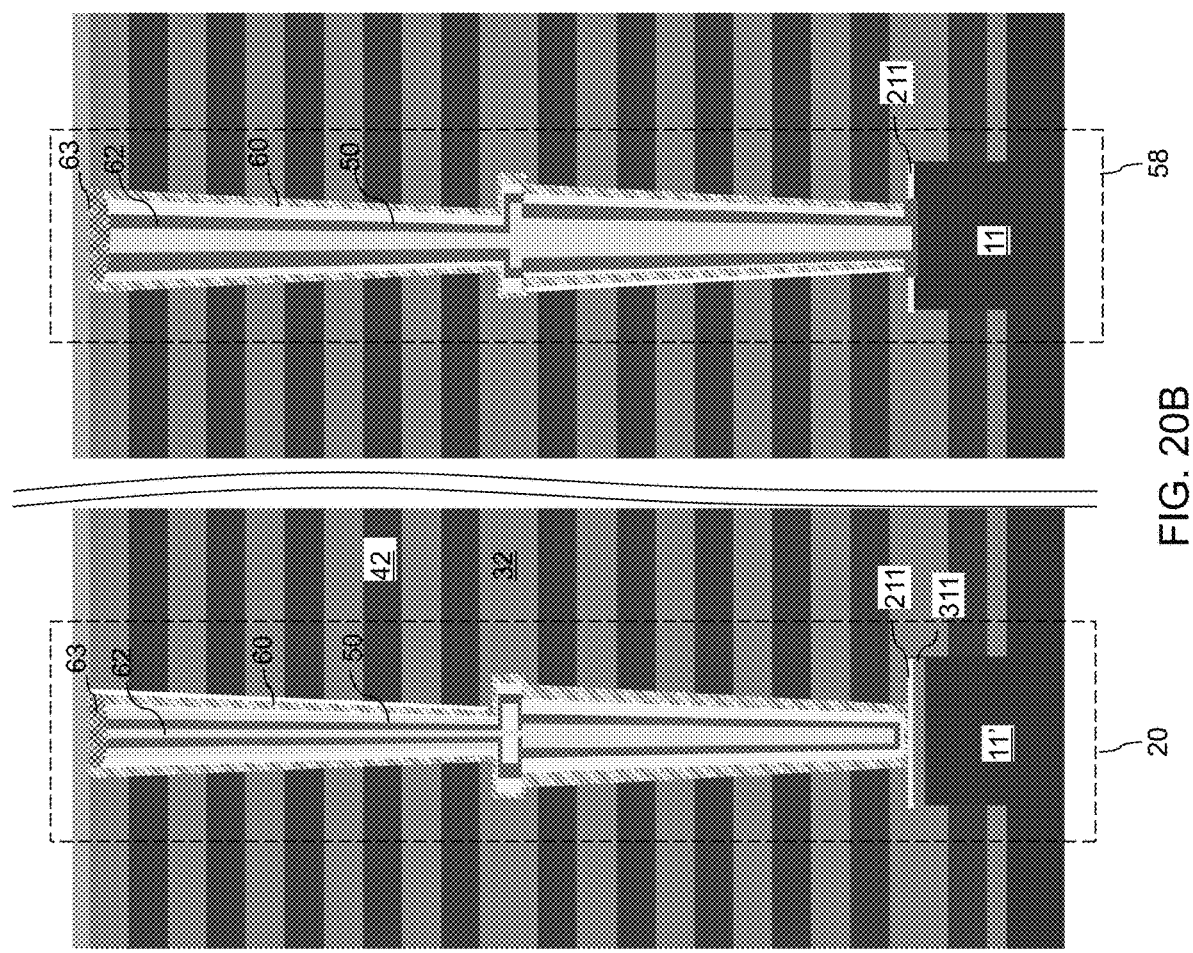
FIG. 20B is a vertical cross-sectional view of the exemplary structure after formation of memory opening fill structures and support pillar structures according to an alternative embodiment of the present disclosure.

Referring to FIG. 20A, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIG. 18. An instance of the support pillar structure 20 can be formed within each support opening 19 of the structure of FIG. 18. In an alternative embodiment shown in FIG. 20B, the support pillar structure 20, the optional first semiconductor channel layer 601, the tunneling dielectric layer 56, the charge storage layer 54, the inner blocking dielectric layer 52, and the optional outer blocking dielectric layer 51 are not anisotropically etched. In this embodiment, the semiconductor oxide plates 211 may be retained in the device.

Figure 21A:
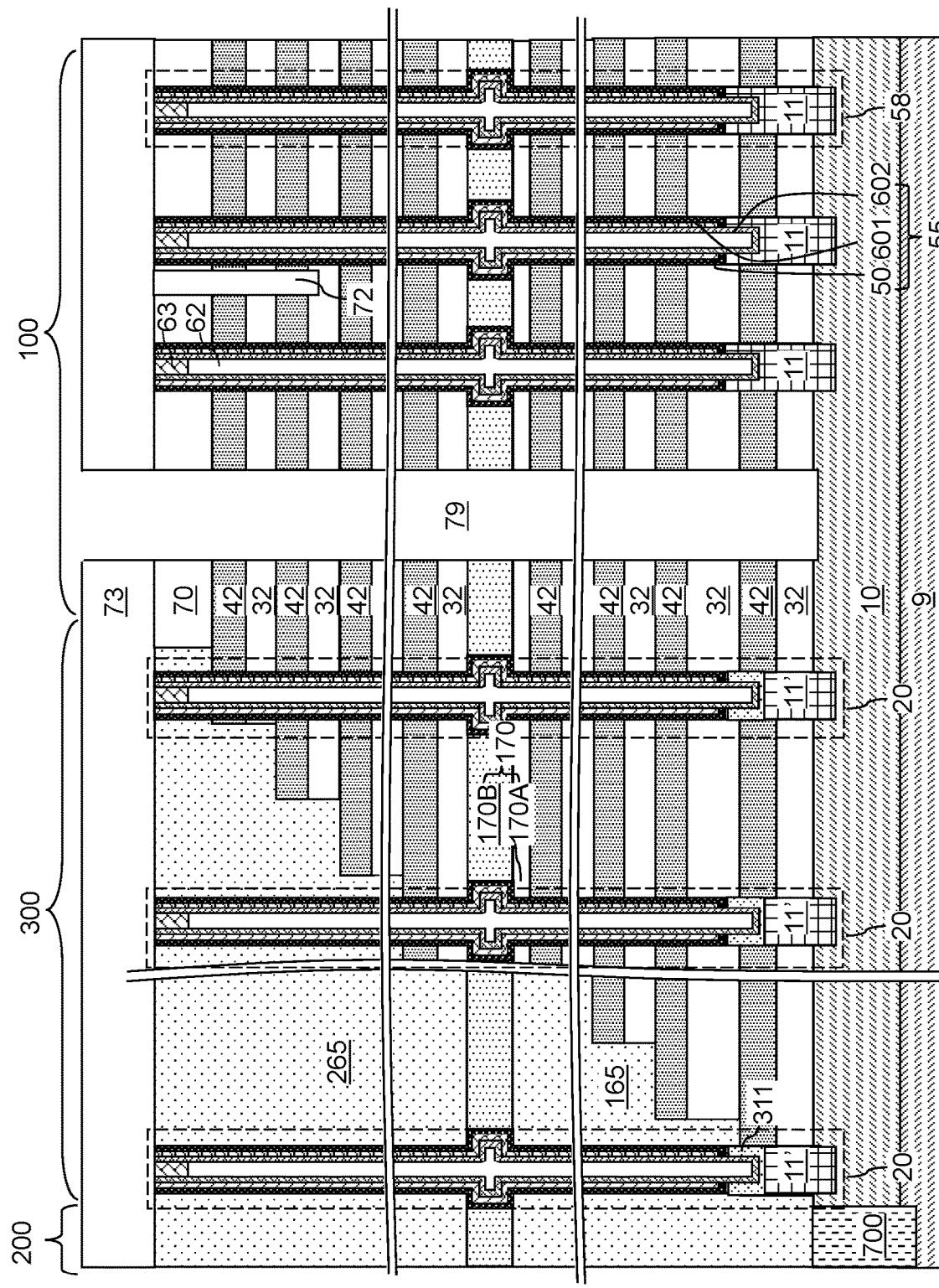
FIG. 21A is a vertical cross-sectional view of the exemplary structure after formation of a contact level dielectric layer and backside trenches according to an embodiment of the present disclosure.

Referring to FIGS. 21A and 21B, a contact level dielectric layer 73 can be formed over the insulating cap layer 70. The contact level dielectric layer 73 can include silicon oxide, and can have thickness in a range from 60 nm to 600 nm, although lesser and greater thicknesses can also be employed. A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the insulating cap layer 70, the alternating stacks (32, 42) and/or the retro-stepped dielectric material portions (165, 265) employing an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

Figure 22:
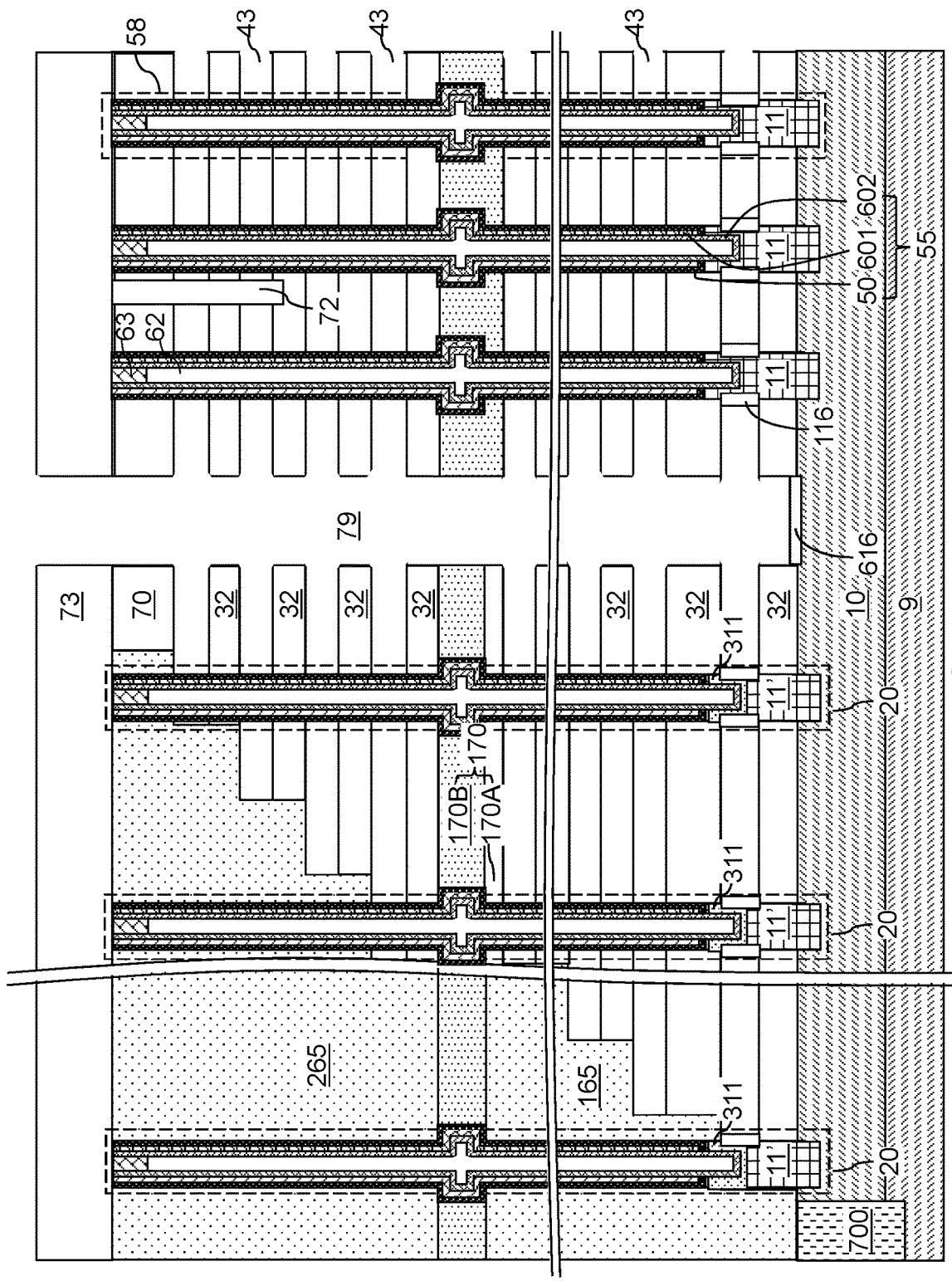
FIG. 22 is a vertical cross-sectional view of the exemplary structure after formation of backside recesses according to an embodiment of the present disclosure.

Referring to FIG. 22, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portions (165, 265), the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portions (165, 265) can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portions (165, 265), and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 23:
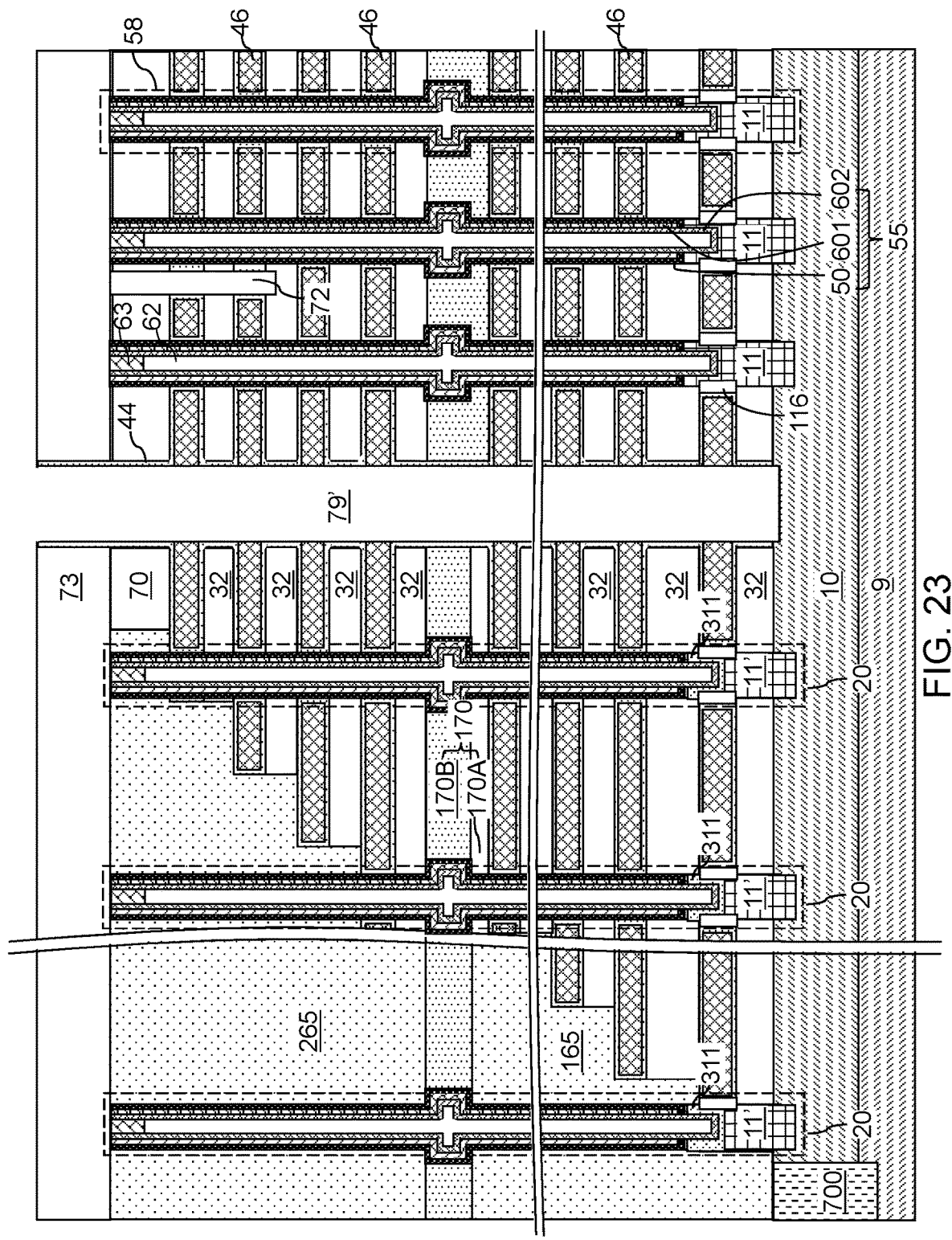
FIG. 23 is a vertical cross-sectional view of the exemplary structure after formation of electrically conductive layers according to an embodiment of the present disclosure.

Referring to FIG. 23, a backside blocking dielectric layer 44 can be optionally formed. The backside blocking dielectric layer 44, if present, comprises a dielectric material that functions as a control gate dielectric for the control gates to be subsequently formed in the backside recesses 43. In case the outer blocking dielectric layer 51 is present within each memory opening, the backside blocking dielectric layer 44 is optional. In case the outer blocking dielectric layer 51 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

At least one metallic material can be deposited in the backside recesses 43. The at least one metallic material can include a metallic barrier layer and a metallic fill material. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN. The metal fill material can be deposited on the metallic barrier layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic barrier layer, which is a metallic barrier layer that blocks diffusion of fluorine atoms therethrough.

A plurality of electrically conductive layers 46 can be formed in the plurality of backside recesses 43, and a continuous electrically conductive material layer can be formed on the sidewalls of each backside trench 79 and over the contact level dielectric layer 73. Each electrically conductive layer 46 includes a portion of the metallic barrier layer and a portion of the metallic fill material layer that are located between a vertically neighboring pair of dielectric material layers such as a pair of insulating layers 32. The continuous electrically conductive material layer includes a continuous portion of the metallic barrier layer and a continuous portion of the metallic fill material layer that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer. A tubular dielectric spacer 116 laterally surrounds a pedestal channel portion {11 or (311, 11')}. A bottommost electrically conductive layer 46 laterally surrounds each tubular dielectric spacer 116 upon formation of the electrically conductive layers 46.

The deposited metallic material of the continuous electrically conductive material layer is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer may not be selective to the material of the backside blocking dielectric layer 44 or, the backside blocking dielectric layer 44 may not be employed. The planar dielectric portions 616 can be removed during removal of the continuous electrically conductive material layer. A backside cavity 79' is present within each backside trench 79.

Figure 24A:
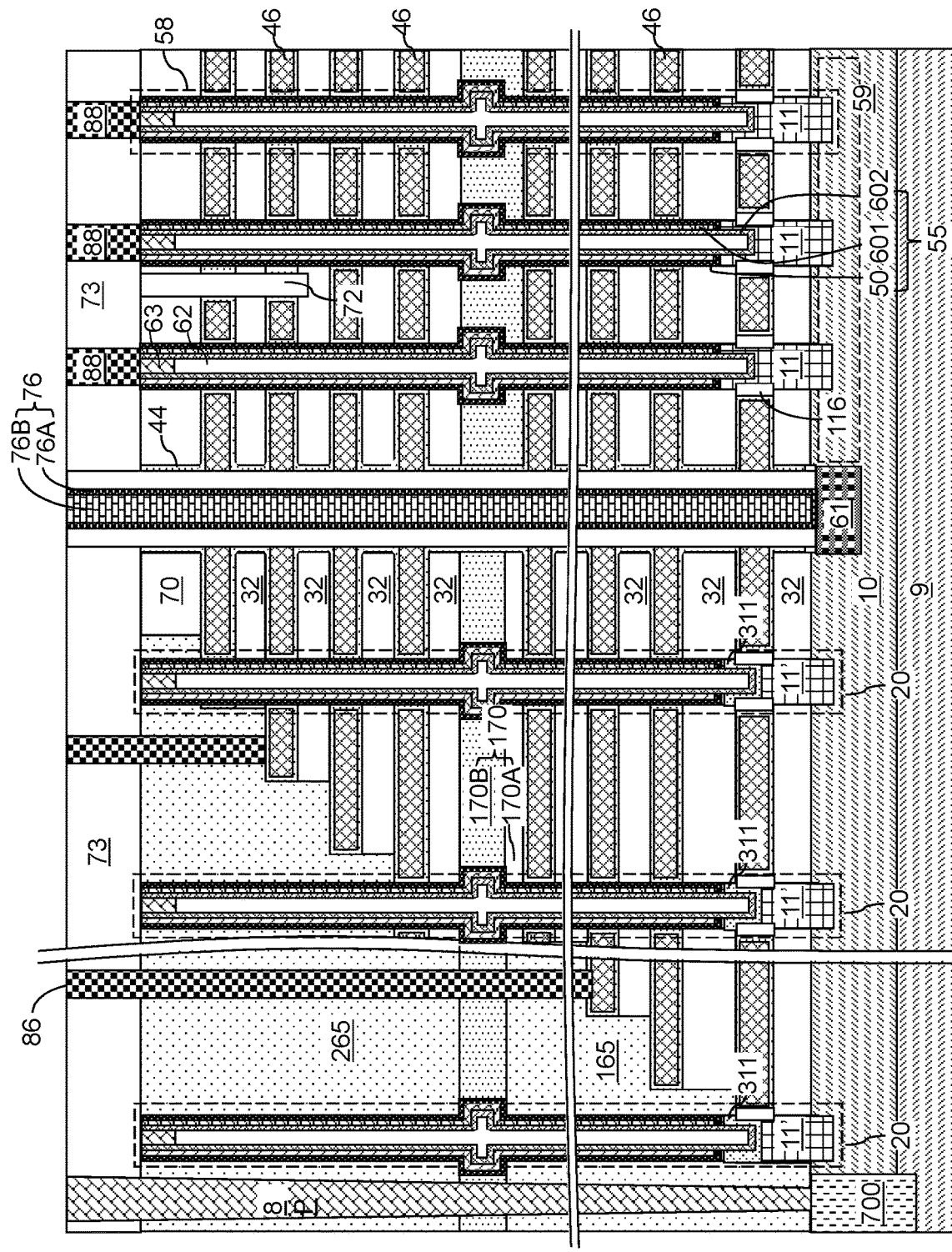
FIG. 24A is a vertical cross-sectional view of the exemplary structure after formation of backside contact via structures, drain contact via structure, layer contact via structures, and peripheral device contact via structures according to an embodiment of the present disclosure.
Figure 24B:
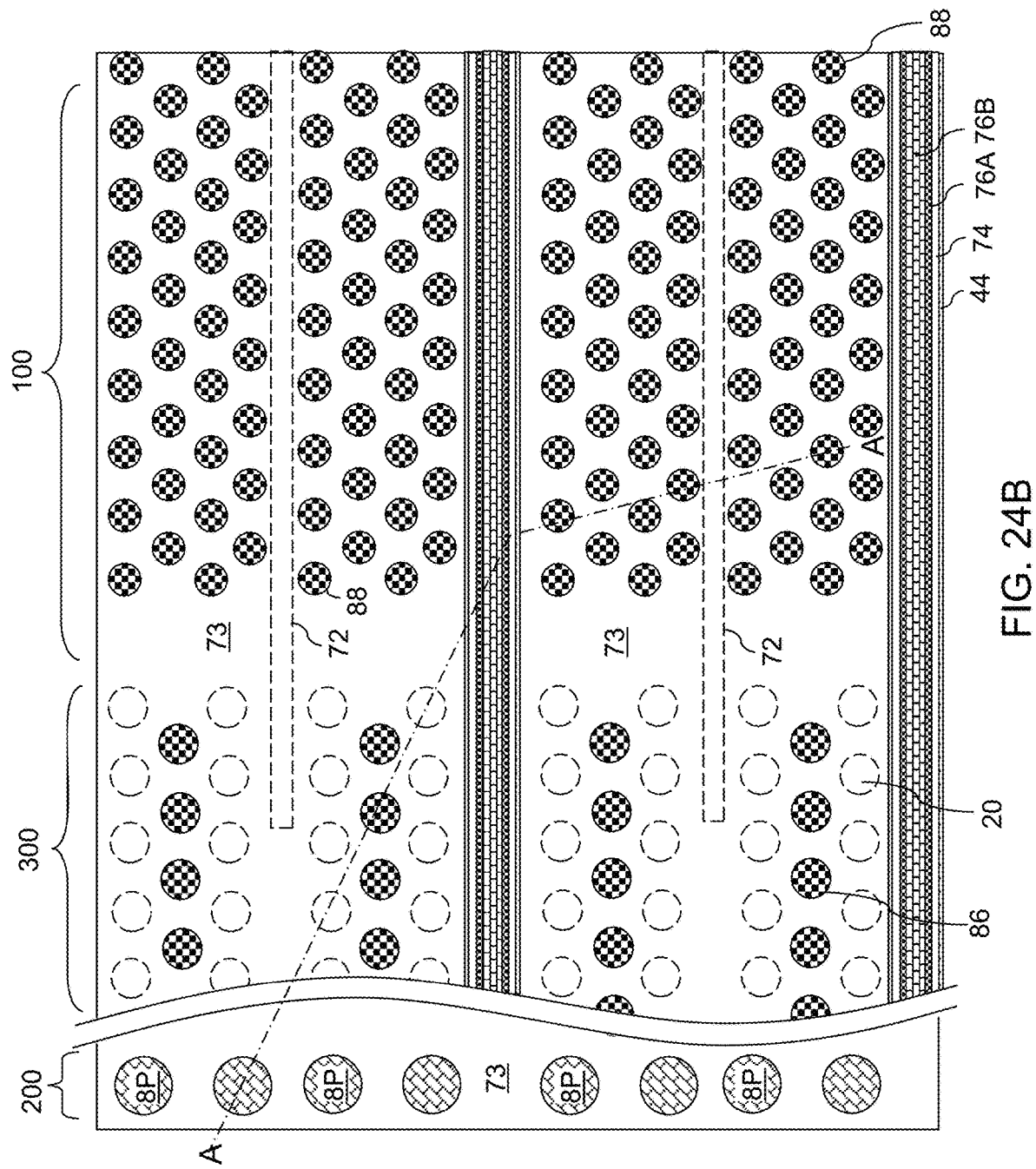
FIG. 24B is a horizontal cross-sectional of the exemplary structure along the horizontal plane B-B' of FIG. 24A. The hinged vertical plane A-A' corresponds to the plane of the vertical cross-sectional view of FIG. 24A.

Referring to FIGS. 24A and 24B, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective backside cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Additional contact via structures (88, 86, 8P) can be formed through the contact level dielectric layer 73, the insulating cap layer 70, and optionally through the retro-stepped dielectric material portions (165, 265). For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portions (165, 265). Peripheral device contact via structures 8P can be formed through the retro-stepped dielectric material portions (165, 265) directly on respective nodes of the peripheral devices. The peripheral device contact via structures 8P includes gate contact via structures that are formed directly on a respective gate electrode and active region contact via structures that are formed directly on a respective active region, which may be a source region or a drain region.

FIGS. 25-34 illustrate a first exemplary processing sequence that can be employed to form a gate contact via structure 8G (illustrated in FIG. 34), which is one of the peripheral contact via structures 8P.

Referring to FIG. 25, a first configuration of the exemplary structure includes a sacrificial planarization stop layer 91, a patterning film 93, and a photoresist layer 95 that can be formed over the first retro-stepped dielectric material portion 165. The inter-tier dielectric layer 170 may optionally be present at this step. An optional silicon nitride barrier layer 780 can be formed over the gate structures (75, 175) prior to forming the retro-stepped dielectric material portion 165. The photoresist layer 95 can be lithographically patterned to form openings that overlie a respective one of the transistor gate structures 75 or the gate structures can include the charge storage transistor gate structures 175. While the present disclosure is described employing an embodiment in which a gate contact via structure 8G is formed on a transistor gate structure 75, embodiments are expressly contemplated in which the gate contact via structure 8G is formed directly on a charge storage transistor gate structure 175.

Referring to FIG. 26, an anisotropic etch process is performed to form a lower gate contact via cavity 89 that extends through the patterning film 93, the sacrificial planarization stop layer 91, the first retro-stepped dielectric material portion 165, the inter-tier dielectric layer 170 (if present at this step), the silicon nitride barrier layer 780 (if present), and optionally the liners (761, 762) up to the silicon nitride gate cap portion 758. The anisotropic etch process can be selective to the silicon nitride gate cap portion 758 or to the silicon nitride dielectric liner 162. The photoresist layer 95 and the patterning film 93 can be subsequently removed, for example, by ashing. The source and drain contact via structures are not shown for clarity.

Referring to FIG. 27, a sacrificial contact via structure 181, such as an amorphous silicon or polysilicon structure is formed in the lower gate contact via cavity 89. The top surface of the sacrificial contact via structure 181 can be recessed below the top surface of the sacrificial planarization stop layer 91. The sacrificial contact via structure 181 can be formed at the same time as the sacrificial support opening fill structures 118 described above, or separately from the sacrificial support opening fill structures 118.

Referring to FIG. 28, the sacrificial planarization stop layer 91 can be removed selective to the first retro-stepped dielectric material portion 165, the inter-tier dielectric layer 170 (if present) and the sacrificial contact via structure 181. If the inter-tier dielectric layer 170 was not formed previously, then the inter-tier dielectric layer 170 can be formed at this time and the steps shown in FIGS. 10 to 15 and described above may be performed at this time.

Referring to FIG. 29, the inter-tier dielectric layer 170 (if not formed earlier) and the second retro-stepped dielectric material portion 265 are formed as described above with respect to FIG. 16A. The steps shown in FIGS. 16A to 23 may then be performed resulting in the formation of the contact level dielectric layer 73 over the second retro-stepped dielectric material portion 265, as described above with respect to FIGS. 21A and 21B. At least one interconnect-level dielectric layer (192, 194, 196, 198), a second patterning film 193, and a second photoresist layer 195 are formed over the contact level dielectric layer 73 and the second retro-stepped dielectric material portion 265. The at least one interconnect-level dielectric layer (192, 194, 196, 198) can include, for example, a first interconnect-level dielectric layer 192, a second interconnect-level dielectric layer 194, a third interconnect-level dielectric layer 196, and a fourth interconnect-level dielectric layer 198.

The photoresist layer 195 can be lithographically patterned to form openings that overlie a respective one of the transistor gate structures 75 or the gate structures can include the charge storage transistor gate structures 175. Specifically, at least one of the openings in the photoresist layer 195 can be formed directly above the sacrificial contact via structure 181.

Referring to FIG. 30, an anisotropic etch process is performed to form an upper gate contact via cavity 189U that extends through the patterning film 193, at least one interconnect-level dielectric layer (192, 194, 196, 198), contact level dielectric layer 73 and the second retro-stepped dielectric material portion 265 to a top surface of the sacrificial contact via structure 181.

Referring to FIG. 31, the sacrificial contact via structure 181 can be removed selective to the etch stop gate semiconductor material portion 75C. In one embodiment, removal of the sacrificial contact via structure 181 can be performed by an isotropic etch process. In one embodiment, the isotropic etch process can include a wet etch process employing hot trimethyl-2 hydroxyethyl ammonium hydroxide ("hot TMY") or tetramethyl ammonium hydroxide (TMAH). During this etching step, the silicon nitride gate cap portion 758 and the metallic silicide portion 754 may be collaterally removed. The etch stop gate semiconductor material portion 75C provides high etch resistance to TMY and TMAH. Thus, collateral etching of etch stop gate semiconductor material portion 75C by the wet etch process is negligible and damage to the underlying gate semiconductor material portion 75B is reduced or avoided. The upper gate contact via cavity 189U can vertically extend down to a top surface of the etch stop gate semiconductor material portion 75C (if all of the metallic silicide portion 754 is collaterally removed) or to the metallic silicide portion 754 (if any remains) to provide a gate contact via cavity 189.

Referring to FIG. 32, a spacer silicon oxide layer 183 can be optionally deposited at the periphery of the gate contact via cavity 189. The thickness of the spacer silicon oxide layer 183 can be in a range from 5 nm to 50 nm, although lesser and greater thicknesses can also be employed. The horizontal surfaces of the spacer silicon oxide layer at the bottom of the contact via cavity 189 and over the at least one interconnect-level dielectric layer (192, 194, 196, 198) are removed by an anisotropic spacer etch to leave the spacer silicon oxide layer 183 only on the sidewalls of the gate contact via cavity 189.

Referring to FIG. 33, the at least one interconnect-level dielectric layer (192, 194, 196, 198) and an upper region of the second retro-stepped dielectric material portion 265 can be patterned to form line cavities or a widened via opening. The spacer silicon oxide layer 183 can be employed to protect the first and second retro-stepped dielectric material portions (165, 265). The spacer silicon oxide layer 183 can be collaterally removed during the pattering step. In some embodiments, the spacer silicon oxide layer 183 is not completely removed during the pattering step.

Referring to FIG. 34, at least one conductive material can be deposited in the gate contact via cavity 189 to form a gate contact via structure 8G. The gate contact via structure 8G can vertically extend from the top surface of the second retro-stepped dielectric material portion 265 to the etch stop gate semiconductor material portion 75C and/or to the metallic silicide portion 754. The gate contact via structure 8G can include a widened upper portion 8M, which may include a line structure or a widened via portion.

Referring to the embodiment of FIGS. 10 to 24B, a three-dimensional memory device comprises an alternating stack of insulating layers 32 and electrically conductive layers 46 located over a substrate (9, 10), a memory opening fill structure 58 extending through the alternating stack (32, 46) and comprising a first pedestal channel portion 11, a first memory film 50 (located within a first-tier memory opening 149) and a first vertical semiconductor channel 60 (located within the first-tier memory opening 149), a staircase region 300 including stepped surfaces of the alternating stack (32, 46), and a support pillar structure 20 extending through a portion of the alternating stack (32, 46) in the staircase region 300 and comprising a second pedestal channel portion (311, 11'), a second memory film 50 (located within a first-tier support opening 119), and a second vertical semiconductor channel 60 (located within the first-tier support openings 119). The second pedestal channel portion (311, 11') comprises an etch stop pedestal segment 311 including a dopant species overlying semiconductor remaining pedestal segment 11'. The etch stop pedestal segment 311 has an etch rate than is at least 5 times less in trimethyl-2 hydroxyethyl ammonium hydroxide (TMY) than the remaining pedestal segment 11'.

In one embodiment, the dopant species comprises carbon, boron, nitrogen, or oxygen. In one embodiment, the remaining pedestal segment 11' is free of the dopant species or includes the dopant species at an atomic concentration that is less than 0.05 times an atomic concentration of the dopant species within the etch stop pedestal segment 311. Preferably, the dopant species comprises boron or carbon.

In one embodiment, the etch stop pedestal segment 311 comprises silicon at an atomic concentration greater than 95%, a p-type or n-type electrical dopant at a concentration in a range from $1 \times 10^{14}/cm^3$ to $1 \times 10^{18}/cm^3$ and the carbon dopant species at a concentration in a range from $5 \times 10^{19}/cm^3$ to $5 \times 10^{21}/cm^3$. The remaining pedestal segment 11' comprises silicon at an atomic concentration greater than 95%, and a p-type or n-type electrical dopant at a concentration in a range from $1 \times 10^{14}/cm^3$ to $1 \times 10^{18}/cm^3$.

In another embodiment, the etch stop pedestal segment 311 comprises silicon at an atomic concentration greater than 95%, and the boron dopant species at a concentration in a range from $5 \times 10^{19}/cm^3$ to $5 \times 10^{21}/cm^3$. The remaining pedestal segment 11' comprises silicon at an atomic concentration greater than 95%, and boron concentration in a range from $1 \times 10^{14}/cm^3$ to $1 \times 10^{18}/cm^3$.

In one embodiment, the memory device can also include a peripheral field effect transistor (790, 791, 792, 793, 794, 795) comprising a gate structure (75, 175) overlying channel 731 and active regions 730, as shown in FIG. 34. The gate structure (75, 175) comprises a vertical stack including a gate dielectric 750 and an etch stop gate semiconductor material portion 75C overlying a remaining semiconductor material portion (75B', 75B). The etch stop gate semiconductor material portion 75C contains a dopant species and has an etch rate than is at least 5 times less in trimethyl-2 hydroxyethyl ammonium hydroxide (TMY) than the remaining semiconductor material portion (75B', 75B).

Referring to the embodiment of FIGS. 1-9 and 25-34, a semiconductor structure comprises a field effect transistor (790, 791, 792, 793, 794, 795) comprising a gate structure (75 or 175) overlying channel 731 and active regions 730. The gate structure (75, 175) comprises a vertical stack including a gate dielectric 750 and an etch stop gate semiconductor material portion 75C overlying a remaining semiconductor material portion (75B', 75B). The etch stop gate semiconductor material portion 75C contains a dopant species and has an etch rate than is at least 5 times less in trimethyl-2 hydroxyethyl ammonium hydroxide (TMY) than the remaining semiconductor material portion (75B', 75B). At least one dielectric material portion (such as at least one retro-stepped dielectric material portion (165, 265)) overlies the gate structure (75 or 175), and a gate contact via structure 8G extending through the at least one dielectric material portion and electrically connected to (e.g., directly contacting or including an intermediate conductive layer between) the etch stop gate semiconductor material portion 75C.

In one embodiment, the dopant species comprises carbon, nitrogen or oxygen, and the remaining semiconductor material portion (75B', 75B) is free of the dopant species or includes the dopant species at an atomic concentration that is less than 0.05 times an atomic concentration of the dopant species within the etch stop gate semiconductor material portion 75C.

In one embodiment, the etch stop gate semiconductor material portion 75C comprises silicon at an atomic concentration greater than 95%, a p-type or n-type electrical dopant at a concentration in a range from $1\times10^{14}/cm^3$ to $1\times10^{18}/cm^3$, and the carbon dopant species at a concentration in a range from $5\times10^{19}/cm^3$ to $5\times10^{21}/cm^3$. The remaining semiconductor material portion (75B', 75B) comprises silicon at an atomic concentration greater than 95%, a p-type or n-type electrical dopant at a concentration in a range from $1\times10^{14}/cm^3$ to $1\times10^{18}/cm^3$, and no carbon or less than $1\times10^{18}/cm^3$ carbon.

In one embodiment, the gate structure (75 or 175) comprises a metallic silicide portion 765 that overlies the etch stop gate semiconductor material portion 75C and laterally surrounds, and contacts, the gate contact via structure 8G.

In one embodiment shown in FIG. 24A, the semiconductor structure further comprises an alternating stack of insulating layers 32 and electrically conductive layers 46 located over the substrate semiconductor layer 9, and a memory stack structure 55 extending through the alternating stack (32, 46) and comprising a memory film 50 and a vertical semiconductor channel 60, a staircase region 300 including stepped surfaces of the alternating stack (32, 46), wherein the at least one dielectric material portion comprises a retro-stepped dielectric material portion (165 and/or 265) that overlies the stepped surfaces and laterally surrounds a portion of the gate contact via structure 8G.

The various three-dimensional memory devices of the present disclosure include a monolithic three-dimensional NAND string memory device, and can be fabricated employing the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers located over a substrate;
a memory opening fill structure extending through the alternating stack and comprising a first pedestal channel portion, a first memory film and a first vertical semiconductor channel;
a staircase region including stepped surfaces of the alternating stack; and
a support pillar structure extending through a portion of the alternating stack in the staircase region and comprising a second semiconductor pedestal channel portion, a second memory film, and a second vertical semiconductor channel,
wherein:
the second semiconductor pedestal channel portion comprises a semiconductor etch stop pedestal segment containing a dopant species and overlying and contacting a semiconductor remaining pedestal segment, and at least one of the semiconductor etch stop pedestal segment and the semiconductor remaining pedestal segment are adjacent to a bottommost electrically conductive layer of the alternating stack,
the etch stop pedestal segment has an etch rate that is at least 5 times less in trimethyl-2 hydroxyethyl ammonium hydroxide (TMY) than the semiconductor remaining pedestal segment, and
a first interface between the first pedestal channel portion and the first memory film and a second interface between the second pedestal channel portion and the second memory film are located entirely between a first horizontal plane including a top surface of one of the insulating layers and a second horizontal plane including a bottom surface of the same one of the insulating layers.

2. The three-dimensional memory device of claim 1, wherein:
the dopant species comprise carbon, boron, nitrogen or oxygen; and
the remaining pedestal segment is free of the dopant species or includes the dopant species at an atomic concentration that is less than 0.05 times an atomic concentration of the dopant species within the etch stop pedestal segment.

3. The three-dimensional memory device of claim 2, wherein the dopant species comprises a boron dopant species or a carbon dopant species.

4. The three-dimensional memory device of claim 3, wherein the dopant species comprises a carbon dopant species, and wherein:

the etch stop pedestal segment comprises silicon at an atomic concentration greater than 95%, the carbon dopant species at a concentration in a range from $5 \times 10^{19}/cm^3$ to $5 \times 10^{21}/cm^3$, and an additional p-type or n-type electrical dopant at a concentration in a range from $1 \times 10^{14}/cm^3$ to $1 \times 10^{18}/cm^3$; and the remaining pedestal segment comprises silicon at an atomic concentration greater than 95%, and a p-type or n-type electrical dopant at a concentration in a range from $1 \times 10^{14}/cm^3$ to $1 \times 10^{18}/cm^3$.

5. The three-dimensional memory device of claim 3, wherein the dopant species comprises a boron dopant species, and wherein:

the etch stop pedestal segment comprises silicon at an atomic concentration greater than 95%, and the boron dopant species at a concentration in a range from $5 \times 10^{19}/cm^3$ to $5 \times 10^{21}/cm^3$; and the remaining pedestal segment comprises silicon at an atomic concentration greater than 95%, and boron concentration in a range from $1 \times 10^{14}/cm^3$ to $1 \times 10^{18}/cm^3$.

6. The three-dimensional memory device of claim 1, further comprising:

a retro-stepped dielectric material portion overlying the stepped surfaces, wherein the support pillar structure extends through the retro-stepped dielectric material portion; and a drain region contacting an upper end of the first vertical semiconductor channel.

7. The three-dimensional memory device of claim 1, further comprising a peripheral field effect transistor comprising a gate structure overlying channel and active regions, wherein:

the gate structure comprises a vertical stack including a gate dielectric and an etch stop gate semiconductor material portion overlying a remaining semiconductor material portion; and the etch stop gate semiconductor material portion contains a dopant species and has an etch rate that is at least 5 times less in trimethyl-2 hydroxyethyl ammonium hydroxide (TMY) than the remaining semiconductor material portion.

8. The three-dimensional memory device of claim 7, further comprising:

at least one dielectric material portion overlying the gate structure; and a gate contact via structure extending through the at least one dielectric material portion and electrically connected to the etch stop gate semiconductor material portion.

9. The semiconductor structure of claim 8, wherein:
the dopant species comprises carbon, nitrogen or oxygen; and the remaining semiconductor material portion is free of the dopant species or includes the dopant species at an atomic concentration that is less than 0.05 times an atomic concentration of the dopant species within the etch stop gate semiconductor material portion.

10. The semiconductor structure of claim 8, wherein:
the etch stop gate semiconductor material portion comprises silicon at an atomic concentration greater than 95%, a p-type or n-type electrical dopant at a concentration in a range from $1 \times 10^{14}/cm^3$ to $1 \times 10^{18}/cm^3$, and the carbon dopant species at a concentration in a range from $5 \times 10^{19}/cm^3$ to $5 \times 10^{21}/cm^3$; and the remaining semiconductor material portion comprises silicon at an atomic concentration greater than 95%, a p-type or n-type electrical dopant at a concentration in a range from $1 \times 10^{14}/cm^3$ to $1 \times 10^{18}/cm^3$, and no carbon or less than $1 \times 10^{18}/cm^3$ carbon.

11. The semiconductor structure of claim 8, wherein the gate structure comprises a metallic silicide portion that overlies the second doped gate semiconductor material portion and laterally surrounds, and contacts, the gate contact via structure.

12. The semiconductor structure of claim 8, wherein the at least one dielectric material portion comprises a retro-stepped dielectric material portion that overlies the stepped surfaces and laterally surrounds a portion of the gate contact via structure.

13. The three-dimensional memory device of claim 1, wherein the bottommost electrically conductive layer of the alternating stack laterally surrounds at least one of the semiconductor etch stop pedestal segment and the semiconductor remaining pedestal segment.

14. The three-dimensional memory device of claim 13, further comprising a tubular dielectric spacer which laterally surrounds the second semiconductor pedestal channel portion, wherein the bottommost electrically conductive layer of the alternating stack laterally surrounds the tubular dielectric spacer.

15. The three-dimensional memory device of claim 1, wherein the second vertical semiconductor channel extends below a horizontal plane including the second interface between the second pedestal channel portion and the second memory film and contacts a sidewall of the second pedestal channel portion.

16. The three-dimensional memory device of claim 1, wherein an entirety of the first interface between the first pedestal channel portion and the first memory film and an entirety of the second interface between the second pedestal channel portion and the second memory film are located entirely between the first horizontal plane and the second horizontal plane.

17. The three-dimensional memory device of claim 1, wherein:

the first interface between the first pedestal channel portion and the first memory film comprises an outer periphery that contacts a sidewall of the one of the insulating layers and an inner periphery contacting a sidewall of the first vertical semiconductor channel; and the second interface between the second pedestal channel portion and the second memory film comprises an outer periphery that contacts another sidewall of the same one of the insulating layers and an inner periphery contacting a sidewall of the second vertical semiconductor channel.

18. The three-dimensional memory device of claim 1, wherein the bottommost electrically conductive layer of the alternating stack underlies the second horizontal plane.

19. The three-dimensional memory device of claim 18, wherein:

the bottommost electrically conductive layer of the alternating stack overlies a bottommost insulating layer of the alternating stack; and the bottommost layer of the alternating stack contacts a top surface of a semiconductor material layer located within the substrate.

20. The three-dimensional memory device of claim 1, further comprising:

a first tubular insulating spacer laterally surrounding and contacting the first semiconductor pedestal channel portion and comprising an oxide of a semiconductor material of the first semiconductor pedestal channel portion; and a second tubular insulating spacer laterally surrounding and contacting the second semiconductor pedestal channel portion and comprising an oxide of a semiconductor material of the second semiconductor pedestal channel portion, wherein an entirety of the first tubular insulating spacer and an entirety of the second tubular insulating spacer are located below and are vertically spaced from the first horizontal plane, and are located above and are vertically spaced from, an interface between a bottommost insulating layer of the alternating stack and a semiconductor material layer within the substrate.

* * * * *